(12) United States Patent
Chandran et al.

(10) Patent No.: US 7,274,045 B2
(45) Date of Patent: Sep. 25, 2007

(54) BORATE PHOSPHOR MATERIALS FOR USE IN LIGHTING APPLICATIONS

(75) Inventors: Ramachandran Gopi Chandran, Karnataka (IN); Madras Venugopal Shankar, Karnataka (IN); Venkatraman Sivaramakrishan, Karnataka (IN); Hari Nadathur Seshadri, Bangalore (IN)

(73) Assignee: Lumination LLC, Valley View, OH (US)

( * ) Notice: Subject to any disclaimer, the term of this patent is extended or adjusted under 35 U.S.C. 154(b) by 370 days.

(21) Appl. No.: 11/082,425

(22) Filed: Mar. 17, 2005

(65) Prior Publication Data

US 2006/0208270 A1 Sep. 21, 2006

(51) Int. Cl.
*H01L 33/00* (2006.01)
(52) U.S. Cl. ........................ 257/100; 257/103
(58) Field of Classification Search ........... 257/79–103
See application file for complete search history.

(56) References Cited

U.S. PATENT DOCUMENTS

| 3,450,642 A | 6/1969 | Hoffman |
| 3,569,764 A | 3/1971 | Hanada et al. |
| 3,617,357 A | 11/1971 | Nagy |

(Continued)

FOREIGN PATENT DOCUMENTS

EP      1 116 418 B1    7/2000

(Continued)

OTHER PUBLICATIONS

Yan Zhang, Zhoubin Lin, Zushu Hu, Guofu Wang, "Growth and spectroscopic properties of $Nd^{3+}$-doped $Sr_3Y_2(BO_3)_4$ crystal", *Journal of Solid State Chemistry*, 177 (2004), pp. 3183-3186.

(Continued)

*Primary Examiner*—Cuong Nguyen
(74) *Attorney, Agent, or Firm*—Fay Sharpe LLP

(57) ABSTRACT

Boron containing phosphor compositions having the formulas (1) $M_3Ln_2(BO_3)_4$ doped with at least one activator selected from the group of $Eu^{2+}$, $Mn^{2+}$, $Pb^{2+}$, $Ce^{3+}$, $Eu^{3+}$, $Tb^{3+}$, and $Bi^{3+}$ where M is at least one of Mg, Ca, Sr, Ba, or Zn, and Ln is at least one of Sc, Y, La, Gd, or Lu; (2) $M_{2-x}M'_x(Al, Ga)_{2-y}(Si, Ge)_y B_2 O_{7-z}N_z:Eu^{2+}$, $Mn^{2+}$, $Pb^{2+}$ where M' is one or more of alkali metals Na and/or K, M" is one or more of alkaline earth Mg, Ca, Sr, Ba or Zn, $0 \leq x \leq 2$, $0 \leq y \leq 2$, $0 \leq z \leq 4$; and $z=x+y$; (3) $M'_{2-x+y}M"_{x-y'}(Al, Ga)_{2-y}(Si, Ge)_y B_2 O_{7-z-y'}N_z X_{y'}:Eu^{2+}$, $Mn^{2+}$, $Pb^{2+}$, where M' is one or more of alkali metals Na and/or K, M" is one or more of alkaline earth metals Mg, Ca, Sr, Ba and/or Zn, $0 \leq x \leq 2$, $0 \leq y \leq 2$, $0 \leq z \leq 4$; $z=x+y$, X=F and/or Cl, and $0 \leq y' \leq 2$; (4) $M'_{2-x}M"_x Al_{2-y+y'}Si_{y-y'}B_2 O_{7-z-y'}N_z X_{y'}:Eu^{2+}$, $Mn^{2+}$, $Pb^{2+}$, where M' and M" are defined above, $0 \leq x \leq 2$, $0 \leq y \leq 2$, $0 \leq z \leq 4$; $z=x+y$, X=F and/or Cl, and $0 \leq y' \leq 2$; (5) $M'_{2-x+x'}M"_{x-x"}Al_{2-y+y'}Si_{y-y'}B_2 O_{7-z-x'-y'}N_z X_{(x'+y')}:Eu^{2+}$, $Mn^{2+}$, $Pb^{2+}$, where M' and M" are defined above, $0 \leq x \leq 2$, $0 \leq y \leq 2$, $0 \leq z \leq 4$; $z=x+y$, X=F and/or Cl, and $0 \leq y' \leq 2$; (6) $MAl_2B_2O_7:Eu^{2+}$, $Mn^{2+}$, $Pb^{2+}$; where M=Mg, Ca, Sr, Ba or Zn; (7) $MAl_{2-x}Si_x B_2 O_{7-x}N_x:Eu^{2+}$, $Mn^{2+}$, $Pb^{2+}$, where M=Mg, Ca, Sr, Ba and/or Zn, and $0 \leq x \leq 2$; and (8) $MAl_2 B_{2-x} Si_x O_{7-x} N_x:Eu^{2+}$, $Mn^{2+}$, $Pb^{2+}$, where M=Mg, Ca, Sr, Ba and/or Zn, and $0 \leq x \leq 2$. Also disclosed are light emitting devices including a light source and at least one of the above phosphor compositions.

19 Claims, 13 Drawing Sheets

U.S. PATENT DOCUMENTS

| | | | |
|---|---|---|---|
| 4,075,532 A | 2/1978 | Piper et al. |
| 4,079,287 A | 3/1978 | Soules et al. |
| 4,267,485 A | 5/1981 | Murakami et al. |
| 4,705,986 A | 11/1987 | Iwama et al. |
| 4,806,824 A | 2/1989 | Paynter et al. |
| 4,874,984 A | 10/1989 | Sigai et al. |
| 4,891,550 A | 1/1990 | Northrop et al. |
| 4,924,141 A | 5/1990 | Taubner et al. |
| 5,041,758 A | 8/1991 | Huiskes et al. |
| 5,049,779 A | 9/1991 | Itsuki et al. |
| 5,207,948 A | 5/1993 | Wolfe et al. |
| 5,350,971 A | 9/1994 | Jeong |
| 5,612,590 A | 3/1997 | Trushell et al. |
| 5,714,836 A | 2/1998 | Hunt et al. |
| 5,731,658 A | 3/1998 | Lengyel et al. |
| 5,731,659 A | 3/1998 | Soules et al. |
| 5,770,917 A | 6/1998 | Yano et al. |
| 5,838,101 A | 11/1998 | Pappalardo |
| 5,851,063 A | 12/1998 | Doughty et al. |
| 5,859,496 A | 1/1999 | Murazaki et al. |
| 5,869,927 A | 2/1999 | Matsuo et al. |
| 5,959,316 A | 9/1999 | Lowery |
| 5,962,971 A | 10/1999 | Chen |
| 5,998,925 A | 12/1999 | Shimizu et al. |
| 6,010,644 A | 1/2000 | Fu et al. |
| 6,013,199 A | 1/2000 | McFarland et al. |
| 6,066,861 A | 5/2000 | Höhn et al. |
| 6,069,440 A | 5/2000 | Shimizu et al. |
| 6,084,250 A | 7/2000 | Jüstel et al. |
| 6,096,243 A | 8/2000 | Oshio et al. |
| 6,116,754 A | 9/2000 | Ocsovai et al. |
| 6,117,362 A | 9/2000 | Yen et al. |
| 6,137,217 A | 10/2000 | Pappalardo et al. |
| 6,153,971 A | 11/2000 | Shimizu et al. |
| 6,165,385 A | 12/2000 | Rao et al. |
| 6,203,726 B1 | 3/2001 | Danielson et al. |
| 6,210,605 B1 | 4/2001 | Srivastava et al. |
| 6,222,312 B1 | 4/2001 | Ghosh et al. |
| 6,246,744 B1 | 6/2001 | Duclos et al. |
| 6,249,328 B1 | 6/2001 | Fukuzawa et al. |
| 6,252,254 B1 | 6/2001 | Soules et al. |
| 6,255,670 B1 | 7/2001 | Srivastava et al. |
| 6,278,135 B1 | 8/2001 | Srivastava et al. |
| 6,294,800 B1 | 9/2001 | Duggal et al. |
| 6,302,959 B2 | 10/2001 | Srivastava et al. |
| 6,319,425 B1 | 11/2001 | Tasaki et al. |
| 6,351,069 B1 | 2/2002 | Lowery et al. |
| 6,366,033 B1 | 4/2002 | Greci et al. |
| 6,369,502 B1 | 4/2002 | Auber et al. |
| 6,380,669 B1 | 4/2002 | Zachau et al. |
| 6,400,097 B1 | 6/2002 | Jin et al. |
| 6,402,987 B1 | 6/2002 | Srivastava et al. |
| 6,409,938 B1 | 6/2002 | Comanzo |
| 6,429,583 B1 | 8/2002 | Levinson et al. |
| 6,466,135 B1 | 10/2002 | Srivastava et al. |
| 6,472,812 B2 | 10/2002 | Vose et al. |
| 6,504,179 B1 | 1/2003 | Ellens et al. |
| 6,513,949 B1 | 2/2003 | Marshall et al. |
| 6,515,314 B1 | 2/2003 | Duggal et al. |
| 6,517,741 B1 | 2/2003 | Feldmann et al. |
| 6,521,915 B2 | 2/2003 | Odaki et al. |
| 6,522,065 B1 | 2/2003 | Srivastava et al. |
| 6,538,371 B1 | 3/2003 | Duggal et al. |
| 6,552,487 B1 | 4/2003 | Ellens et al. |
| 6,555,958 B1 | 4/2003 | Srivastava et al. |
| 6,576,931 B2 | 6/2003 | Furukawa et al. |
| 6,580,097 B1 | 6/2003 | Soules et al. |
| 6,592,780 B2 | 7/2003 | Höhn et al. |
| 6,596,195 B2 | 7/2003 | Srivastava et al. |
| 6,621,211 B1 | 9/2003 | Srivastava et al. |
| 6,660,186 B2 | 12/2003 | Ravilisetty |
| 6,669,866 B1 | 12/2003 | Kummer et al. |
| 6,717,353 B1 | 4/2004 | Mueller et al. |
| 6,730,942 B2 * | 5/2004 | Mabuchi et al. ............ 257/100 |
| 7,138,660 B2 * | 11/2006 | Ota et al. ..................... 257/79 |
| 7,189,340 B2 * | 3/2007 | Shimomura et al. .......... 257/98 |
| 2002/0105266 A1 | 8/2002 | Mayr et al. |
| 2002/0158565 A1 | 10/2002 | Setlur et al. |
| 2002/0195587 A1 | 12/2002 | Srivastava et al. |
| 2003/0030060 A1 | 2/2003 | Okazaki |

FOREIGN PATENT DOCUMENTS

| | | |
|---|---|---|
| EP | 1 095 998 A2 | 10/2000 |
| EP | 1 139 440 A2 | 10/2001 |
| WO | WO 00/33389 | 6/2000 |
| WO | WO 01/93342 A1 | 6/2001 |
| WO | WO 01/89000 A1 | 11/2001 |
| WO | WO 01/89001 A2 | 11/2001 |
| WO | WO 02/099902 A1 | 12/2002 |

OTHER PUBLICATIONS

G. Blasse and A. Bril, "On the $Eu^{3+}$ Fluorescence in Mixed Metal Oxides. III. Energy Transfer in $Eu^{3+}$—Activated Tungstates and Molybdates of the Type $Ln_2 WO_6$ and $Ln_2MoO_6$", *The Journal of Chemical Physics*, vol. 45, No. 7, Oct. 1966, pp. 2350-2355.

J.S. Kim et al.: "gaN-based white-light-emitting diodes fabricated with a mixture of Ba3Mgsi208:eu and Sr2Si04: Eu phohors", *Japanese Journal of Applied Physics*, vol. 43, No. 3, 2004, pp. 989-992.

Narukawa, Yukio, "Present Status of UV-LDs and White LEDs", Patented Abstracts of the International Synoposium on The Light for the 2$^{nd}$ Century, Mar. 2002, Tokyo, K-4, pp. 14-15.

Inorganic Phosphors: Compositions, Preparation and Optical Properties, CRC Press, 2004.

S. Schmid and W. Schick, Synthesis and Crystal Structure of the First Oxonitridoborate—$Sr_3[B_3O_3N_3]$, *Z. Anorg. Allg. Chem.* 2002, 628, pp. 1192-1195.

M. Orth, R. Hoffmann R. Pottgen, W. Schnick, Orthonitridoborate Ions $[BN_3]^{6-}$ in Oxonitridosilicate Cages: Synthesis, Crystal Structure, and Magnetic Properties of $Ba_4Pr_7[Si_{12}N_{23}O][BN_3]$, $Ba_4Nd_7[Si_{12}N_{23}O][BN_3]$, and $Ba_4Sm_7[Si_{12}N_{23}O][BN_3]$, *Chem. Eur. J.* 2001, 7, No. 13, pp. 2791-2797.

* cited by examiner

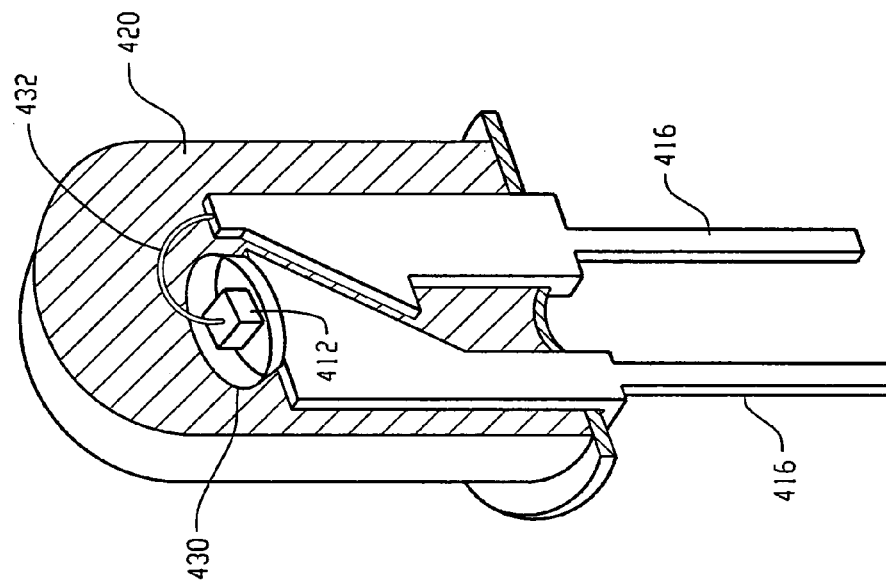
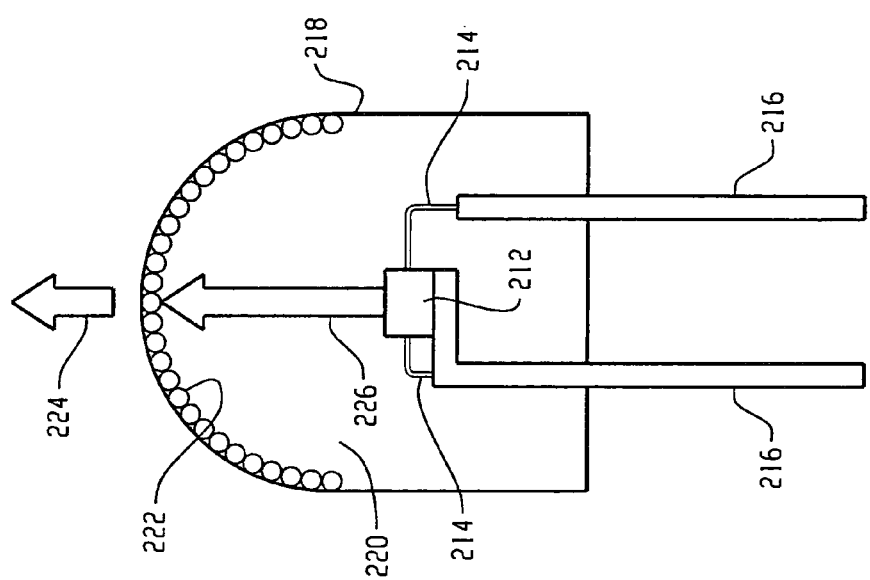
Fig. 4
Fig. 3

$(Sr_{0.95}Eu_{0.05})_3Sc_2(BO_3)_4$ $(Ca_{0.95}Mn_{0.05})_3Y_2(BO_3)_4$ $Ca_{0.9}NaAlSiB_2O_5N_2:Mn^{2+}$

Sr$_{0.9}$NaAlSiB$_2$O$_5$N$_2$:Eu$^{2+}$

Sr$_{0.9}$Si$_2$B$_2$O$_5$N$_2$:Eu$^{2+}$

BORATE PHOSPHOR MATERIALS FOR USE IN LIGHTING APPLICATIONS

BACKGROUND

The present exemplary embodiments relate to phosphor compositions and a lighting apparatus employing these compositions. It finds particular application in conjunction with light emitting diodes, and will be described with particular reference thereto. However, it is to be appreciated that the present exemplary embodiment is also amenable to other like applications.

Light emitting diodes (LEDs) are semiconductor light emitters often used as a replacement for other light sources, such as incandescent lamps. They are particularly useful as display lights, warning lights and indicating lights or in other applications where colored light is desired. The color of light produce by an LED is dependent on the type of semiconducting material used in its manufacture.

Colored semiconductor light emitting devices, including light emitting diodes and lasers (both are generally referred to herein as LEDs), have been produced from Group III-V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum may be generated. Colored LEDs are often used in toys, indicator lights and other devices. Manufacturers are continuously looking for new colored phosphors for use in such LEDs to produce custom colors and higher luminosity.

In addition to colored LEDs, a combination of LED generated light and phosphor generated light may be used to produce white light. The most popular white LEDs consist of blue emitting GaInN chips. The blue emitting chips are coated with a phosphor that converts some of the blue radiation to a complimentary color, e.g. a yellow-green emission. Together, the blue and yellow-green radiation produces a white light. There are also white LEDs that utilize a UV emitting chip and a phosphor blend including red, green and blue emitting phosphors designed to convert the UV radiation to visible light.

One known yellow-whitish light emitting device comprises a blue light-emitting LED having a peak emission wavelength in the near UV-to-blue range (from about 315 nm to about 480 nm) combined with a yellow light-emitting phosphor, such as cerium doped yttrium aluminum garnet $Y_3Al_5O_{12}:Ce^{3+}$ ("YAG:Ce"). The phosphor absorbs a portion of the radiation emitted from the LED and converts the absorbed radiation to a yellow light. The remainder of the blue light emitted by the LED is transmitted through the phosphor and is mixed with the yellow light emitted by the phosphor. A viewer perceives the mixture of blue and yellow light, which in most instances is perceived as a whitish-yellow light.

Such systems can be used to make white light sources having correlated color temperatures (CCTs) of >4500 K and color rendering indices (CRIs) ranging from about 75-82. While this range is suitable for many applications, general illumination sources usually require higher CRIs and lower CCTs.

Other white light LED lighting systems use a UV or visible light LED chip along with a blend of red, green, and/or blue phosphors that can be efficiently excited by near-UV radiation to make white light. However, a continuing need is felt for new phosphor compositions that display more flexibility in emission color, higher CRI values, and lower CCTs than the currently available phosphors.

Thus, a continuing need exists for new phosphors for use in conjunction with UV and visible LED chips displaying high quantum efficiency to produce both colored and white-light LEDs having a high CRI.

BRIEF DESCRIPTION

In accordance with one aspect of the present exemplary embodiment, there is provided a light emitting device including a semiconductor light source and a phosphor composition including at least one of: (1) $M_3Ln_2(BO_3)_4$ doped with at least one activator selected from the group of $Eu^{2+}$, $Mn^{2+}$, $Pb^{2+}$, $Ce^{3+}$, $Eu^{3+}$, $Tb^{3+}$, and $Bi^{3+}$ where M is at least one of Mg, Ca, Sr, Ba, or Zn, and Ln is at least one of Sc, Y, La, Gd, or Lu; (2) $M_{2-x}M'_x(Al, Ga)_{2-y}(Si, Ge)_yB_2O_{7-z}N_z:Eu^{2+}$, $Mn^{2+}$, $Pb^{2+}$ where M' is one or more of alkali metals Na and/or K, M" is one or more of alkaline earth Mg, Ca, Sr, Ba or Zn, $0 \leq x \leq 2$, $0 \leq y \leq 2$, $0 \leq z \leq 4$; and z=x+y; (3) $M'_{2-x+y}M''_{x-y}(Al, Ga)_{2-y}(Si, Ge)_yB_2O_{7-z-y'}N_zX_{y'}:Eu^{2+}$, $Mn^{2+}$, $Pb^{2+}$, where M' is one or more of alkali metals Na and/or K, M" is one or more of alkaline earth metals Mg, Ca, Sr, Ba and/or Zn, $0 \leq x \leq 2$, $0 \leq y \leq 2$, $0 \leq z \leq 4$; z=x+y, X=F and/or Cl, and $0 \leq y' \leq 2$; (4) $M'_{2-x}M''_xAl_{2-y+y'}Si_{y-y'}B_2O_{7-z-y'}N_zX_{y'}:Eu^{2+}$, $Mn^{2+}$, $Pb^{2+}$, where M' and M" are defined above, $0 \leq x \leq 2$, $0 \leq y \leq 2$, $0 \leq z \leq 4$; z=x+y, X=F and/or Cl, and $0 \leq y' \leq 2$; (5) $M'_{2-x+y}M''_{x-x''}Al_{2-y+y'}Si_{y-y'}B_2O_{7-z-x'-y'}N_zX_{(x'+y')}:Eu^{2+}$, $Mn^{2+}$, $Pb^{2+}$, where M' and M" are defined above, $0 \leq x \leq 2$, $0 \leq y \leq 2$, $0 \leq z \leq 4$; z=x+y, X=F and/or Cl, and $0 \leq y' \leq 2$; (6) $MAl_2B_2O_7:Eu^{2+}$, $Mn^{2+}$, $Pb^{2+}$; where M=Mg, Ca, Sr, Ba or Zn; (7) $MAl_{2-x}Si_xB_2O_{7-x}M_x:Eu^{2+}$, $Mn^{2+}$, $Pb^{2+}$, where M=Mg, Ca, Sr, Ba and/or Zn, and $0 \leq x \leq 2$; and (8) $MAl_2B_{2-x}Si_xO_{7-x}N_x:Eu^{2+}$, $Mn^{2+}$, $Pb^{2+}$, where M=Mg, Ca, Sr, Ba and/or Zn, and $0 \leq x \leq 2$.

In a second aspect, there is provided a phosphor having the formula $M_3Ln_2(BO_3)_4$ doped with at least one activator selected from the group of $Eu^{2+}$, $Mn^{2+}$, $Pb^{2+}$, $Ce^{3+}$, $Eu^{3+}$, $Tb^{3+}$, and $Bi^{3+}$ where M is at least one of Mg, Ca, Sr, Ba, or Zn, and Ln is at least one of Sc, Y, La, Gd, or Lu.

In an third aspect, there is provided a phosphor having the formula $M_{2-x}M'_x(Al, Ga)_{2-y}(Si, Ge)_yB_2O_{7-z}N_z:Eu^{2+}$, $Mn^{2+}$, $Pb^{2+}$ where M' is one or more of alkali metals Na and/or K, M" is one or more of alkaline earth Mg, Ca, Sr, Ba or Zn, $0 \leq x \leq 2$, $0 \leq y \leq 2$, $0 \leq z \leq 4$; and $z=x+y$.

In a fourth aspect, there is provided a phosphor blend including at least one of (1) $M_3Ln_2(BO_3)_4$ doped with at least one activator selected from the group of $Eu^{2+}$, $Mn^{2+}$, $Pb^{2+}$, $Ce^{3+}$, $Eu^{3+}$, $Tb^{3+}$, and $Bi^{3+}$ where M is at least one of Mg, Ca, Sr, Ba, or Zn, and Ln is at least one of Sc, Y, La, Gd, or Lu; (2) $M_{2-x}M'_x(Al, Ga)_{2-y}(Si, Ge)_y B_2 O_{7-z} N_z:Eu^{2+}$, $Mn^{2+}$, $Pb^{2+}$ where M' is one or more of alkali metals Na and/or K, M" is one or more of alkaline earth Mg, Ca, Sr, Ba or Zn, $0 \leq x \leq 2$, $0 \leq y \leq 2$, $0 \leq z \leq 4$; and $z=x+y$; (3) $M'_{2-x+y'} M''_{x-y'}(Al, Ga)_{2-y}(Si, Ge)_y B_2 O_{7-z-y'} N_z X_{y'}:Eu^{2+}$, $Mn^{2+}$, $Pb^{2+}$, where M' is one or more of alkali metals Na and/or K, M" is one or more of alkaline earth metals Mg, Ca, Sr, Ba and/or Zn, $0 \leq x \leq 2$, $0 \leq y \leq 2$, $0 \leq z \leq 4$; $z=x+y$, X=F and/or Cl, and $0 \leq y' \leq 2$; (4) $M'_{2-x}M''_x Al_{2-y+y'} Si_{y-y'} B_2 O_{7-z-y'} N_z X_{y'}:Eu^{2+}$, $Mn^{2+}$, $Pb^{2+}$, where M' and M" are defined above, $0 \leq x \leq 2$, $0 \leq y \leq 2$, $0 \leq z \leq 4$; $z=x+y$, X=F and/or Cl, and $0 \leq y' \leq 2$; (5) $M'_{2-x+x''} M''_{x-x''} Al_{2-y+y'} Si_{y-y'} B_2 O_{7-z-x'-y'} N_z X_{(x'+y')}:Eu^{2+}$, $Mn^{2+}$, $Pb^{2+}$, where M' and M" are defined above, $0 \leq x \leq 2$, $0 \leq y \leq 2$, $0 \leq z \leq 4$; $z=x+y$, X=F and/or Cl, and $0 \leq y' \leq 2$; (6) $MAl_2B_2O_7:Eu^{2+}$, $Mn^{2+}$, $Pb^{2+}$; where M=Mg, Ca, Sr, Ba or Zn; (7) $MAl_{2-x}Si_xB_2O_{7-x}N_x:Eu^{2+}$, $Mn^{2+}$, $Pb^{2+}$, where M=Mg, Ca, Sr, Ba and/or Zn, and $0 \leq x \leq 2$; and (8) $MAl_2B_{2-x}Si_xO_{7-x}N_x:Eu^{2+}$, $Mn^{2+}$, $Pb^{2+}$, where M=Mg, Ca, Sr, Ba and/or Zn, and $0 \leq x \leq 2$; and at least one additional phosphor.

BRIEF DESCRIPTION OF THE DRAWINGS

FIG. 3 is a schematic cross-sectional view of an illumination system in accordance with a third embodiment of the present invention.

FIG. 4 is a cutaway side perspective view of an illumination system in accordance with a fourth embodiment of the present invention.

DETAILED DESCRIPTION

Phosphors convert radiation (energy) to visible light. Different combinations of phosphors provide different colored light emissions. The colored light that originates from the phosphors provides a color temperature. Novel phosphor compositions are presented herein as well as their use in LED and other light sources.

A phosphor conversion material (phosphor material) converts generated UV or visible radiation to a different wavelength visible light. The color of the generated visible light is dependent on the particular components of the phosphor material. The phosphor material may include only a single phosphor composition or two or more phosphors of basic color, for example a particular mix with one or more of a yellow and red phosphor to emit a desired color (tint) of light. As used herein, the term "phosphor material" is intended to include both a single phosphor composition as well as a blend of two or more phosphors unless otherwise noted.

It was determined that an LED lamp that produces a bright-white light would be useful to impart desirable qualities to LEDs as light sources. Therefore, in one embodiment, a luminescent material phosphor conversion material blend (phosphor blend) coated LED chip is disclosed for providing white light. The individual phosphors and a phosphor blend including the individual phosphors convert radiation at a specified wavelength, for example radiation from about 250 to 550 nm as emitted by a near UV or visible LED, into a different wavelength visible light. The visible light provided by the phosphor blend (and LED chip if emitting visible light) comprises a bright white light with high intensity and brightness.

Figure 1:
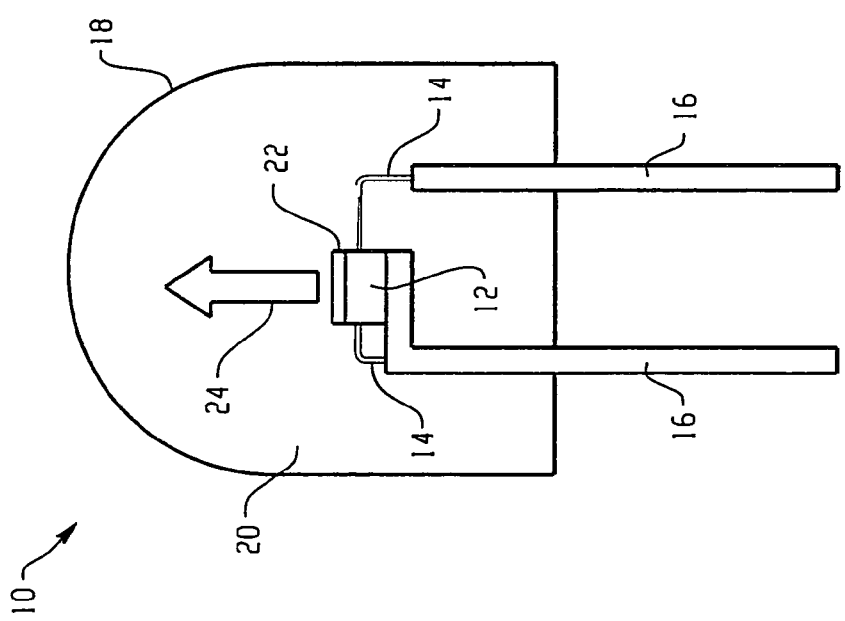
FIG. 1 is a schematic cross-sectional view of an illumination system in accordance with one embodiment of the present invention.

With reference to FIG. 1, an exemplary light emitting assembly or lamp 10 is shown in accordance with one preferred structure of the present invention. The light emitting assembly 10 comprises a semiconductor UV or visible radiation source, such as a light emitting diode (LED) chip 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation.

The lamp may include any semiconductor visible or UV light source that is capable of producing white light when its emitted radiation is directed onto the phosphor. The preferred emission of the LED chip in the present invention will depend on the identity of the phosphors in the disclosed embodiments. However, the emission of the LED will generally have a wavelength in the range from about 250 to about 550 nm, which corresponds to an emission ranging from UV to green. Typically then, the semiconductor light source comprises an LED doped with various impurities. Thus, the LED may comprise a semiconductor diode based on any suitable III-V, II-VI or IV-IV semiconductor layers and having an emission wavelength of about 250 to 550 nm.

Preferably, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $i+j+k=1$) having an emission wavelength greater than about 250 nm and less than about 550 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and a phosphor composition 22 (described below). In an alternate embodiment, the lamp 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor composition 22 radiationally coupled to the LED chip 12. Radiationally coupled means that the elements are associated with each other so radiation from one is transmitted to the other. In a preferred embodiment, the phosphor composition 22 is a blend of two or more phosphors, as will be detailed below.

This phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of the phosphor composition 22 and LED 12. Thus, the phosphor composition 22 may be coated over or directly on the light emitting surface of the LED chip 12 by coating and drying the phosphor suspension over the LED chip 12. Both the shell 18 and the encapsulant 20 should be transparent to allow light 24 to be transmitted through those elements. Although not intended to be limiting, in one embodiment, the median particle size of the phosphor composition may be from about 1 to about 10 microns.

Figure 2:
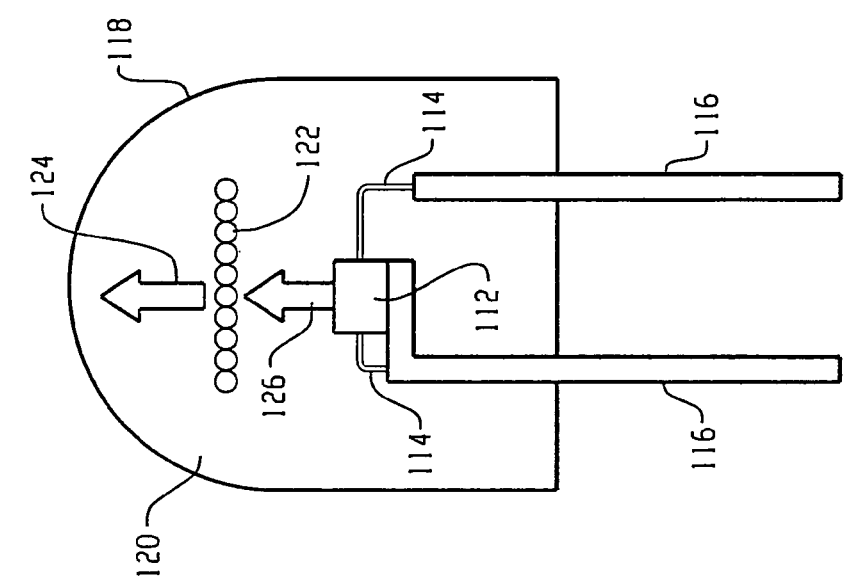
FIG. 2 is a schematic cross-sectional view of an illumination system in accordance with a second embodiment of the present invention.

FIG. 2 illustrates a second exemplary structure of the system. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material 120 or, more preferably, throughout the entire volume of the encapsulant material. Radiation 126 emitted by the LED chip 112 mixes with the light emitted by the phosphor composition 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer loading.

FIG. 3 illustrates a third exemplary structure of the system. The structure of the embodiment shown in FIG. 3 is similar to that of FIG. 1, except that the phosphor composition 222 is coated onto a surface of the shell 218, instead of being formed over the LED chip 212. The phosphor composition is preferably coated on the inside surface of the shell 218, although the phosphor may be coated on the outside surface of the shell, if desired. The phosphor composition 222 may be coated on the entire surface of the shell or only a top portion of the surface of the shell. The radiation 226 emitted by the LED chip 212 mixes with the light emitted by the phosphor composition 222, and the mixed light appears as white light 224. Of course, the structures of FIGS. 1-3 may be combined and the phosphor may be located in any two or all three locations or in any other suitable location, such as separately from the shell or integrated into the LED.

In any of the above structures, the lamp 10 may also include a plurality of scattering particles (not shown), which are embedded in the encapsulant material. The scattering particles may comprise, for example, $Al_2O_3$ particles such as alumina powder or $TiO_2$ particles. The scattering particles effectively scatter the coherent light emitted from the LED chip, preferably with a negligible amount of absorption.

As shown in a fourth preferred structure in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

In a first embodiment, the phosphor composition includes a borate phosphor having the formula $M_3Ln_2(BO_3)_4$ doped with at least one activator selected from the group of $Eu^{2+}$, $Mn^{2+}$, $Pb^{2+}$, $Ce^{3+}$, $Eu^{3+}$, $Tb^{3+}$, and $Bi^{3+}$ where M is at least one of Mg, Ca, Sr, Ba, or Zn, and Ln is at least one of Sc, Y, La, Gd, or Lu. In this embodiment, the LED chip preferably has a peak emission in the range of from 200-500 nm, more preferably from 220-410 nm. In the crystal arrangement, the divalent activators are thought to be situated at the site where M atoms would be while the trivalent activators take the place of Ln atoms. Thus, in the above formula, one or both of the M and Ln may be substituted with a dopant.

Exemplary compounds of this embodiment include: $(Sr_{0.95}Eu_{0.05})_3Y_2(BO_3)_4$; $Sr_3(Y_{0.95}Ce_{0.5})_2(BO_3)_4$; $Sr_3Y_{1.9}Eu_{0.1}(BO_3)_4$; $(Sr_{0.95}Eu_{0.05})_3Sc_2(BO_3)_4$; $Sr_3(Y_{0.45}Sc_{0.5}Ce_{0.05})_2(BO_3)_4$; $Sr_3Sc_{1.9}Eu_{0.1}(BO_3)_4$; and $(Ca_{0.95}Mn_{0.05})_3Y_2(BO_3)_4$.

Figure 5:
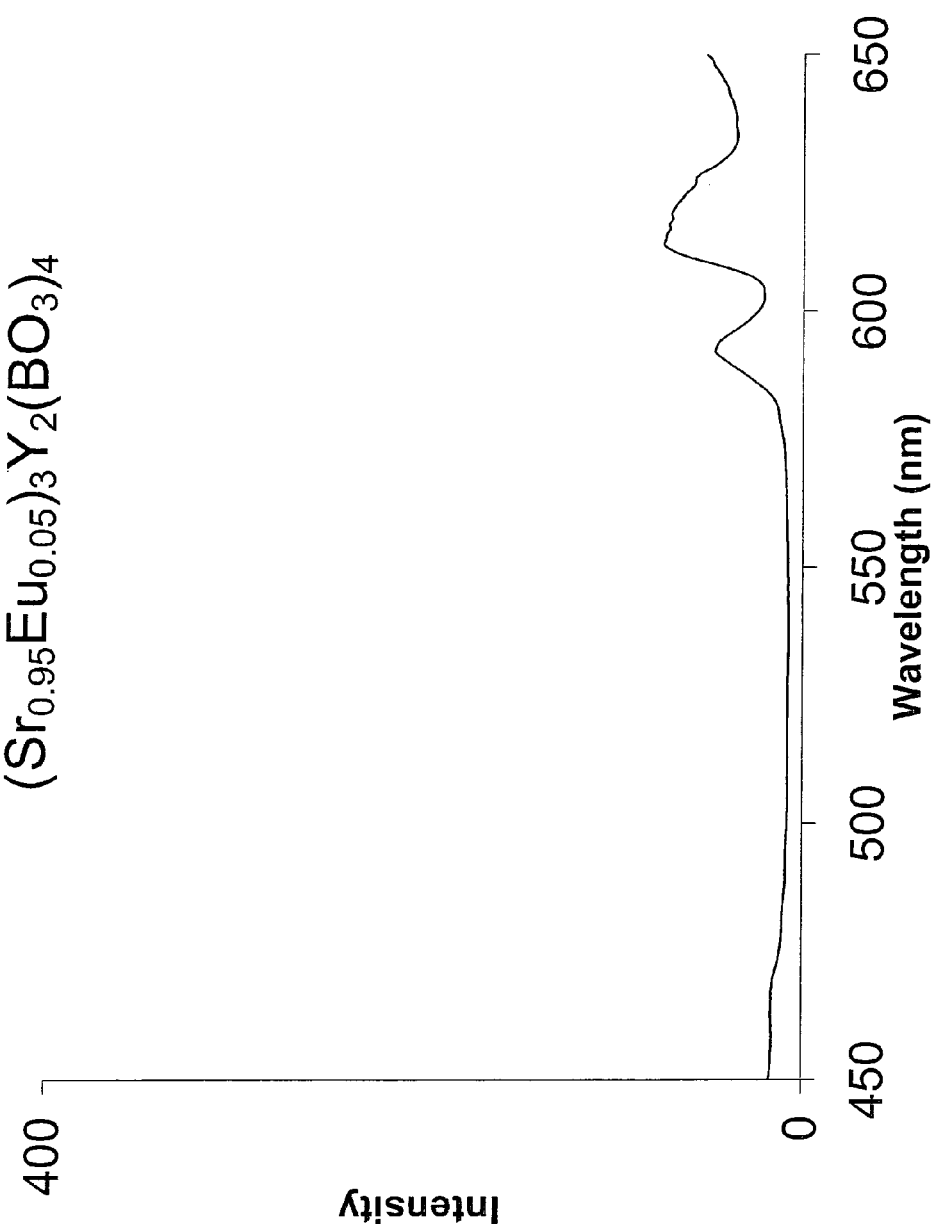
FIG. 5 is a graph showing the emission spectra of $(Sr_{0.95}Eu_{0.05})_3Y_2(BO_3)_4$ at an excitation wavelength of 405 nm.
Figure 6:
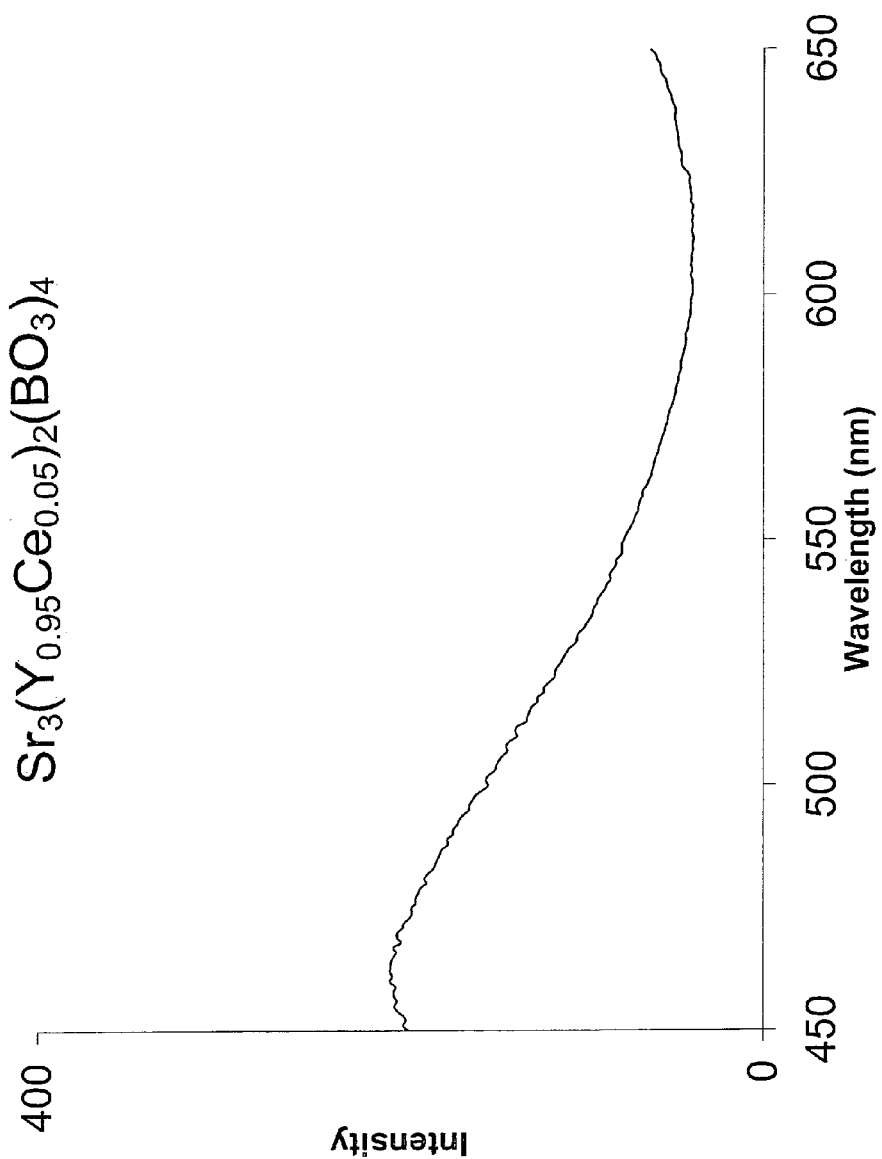
FIG. 6 is a graph showing the emission spectra of $Sr_3(Y_{0.95}Ce_{0.05})_2(BO_3)_4$ at an excitation wavelength of 405 nm.
Figure 7:
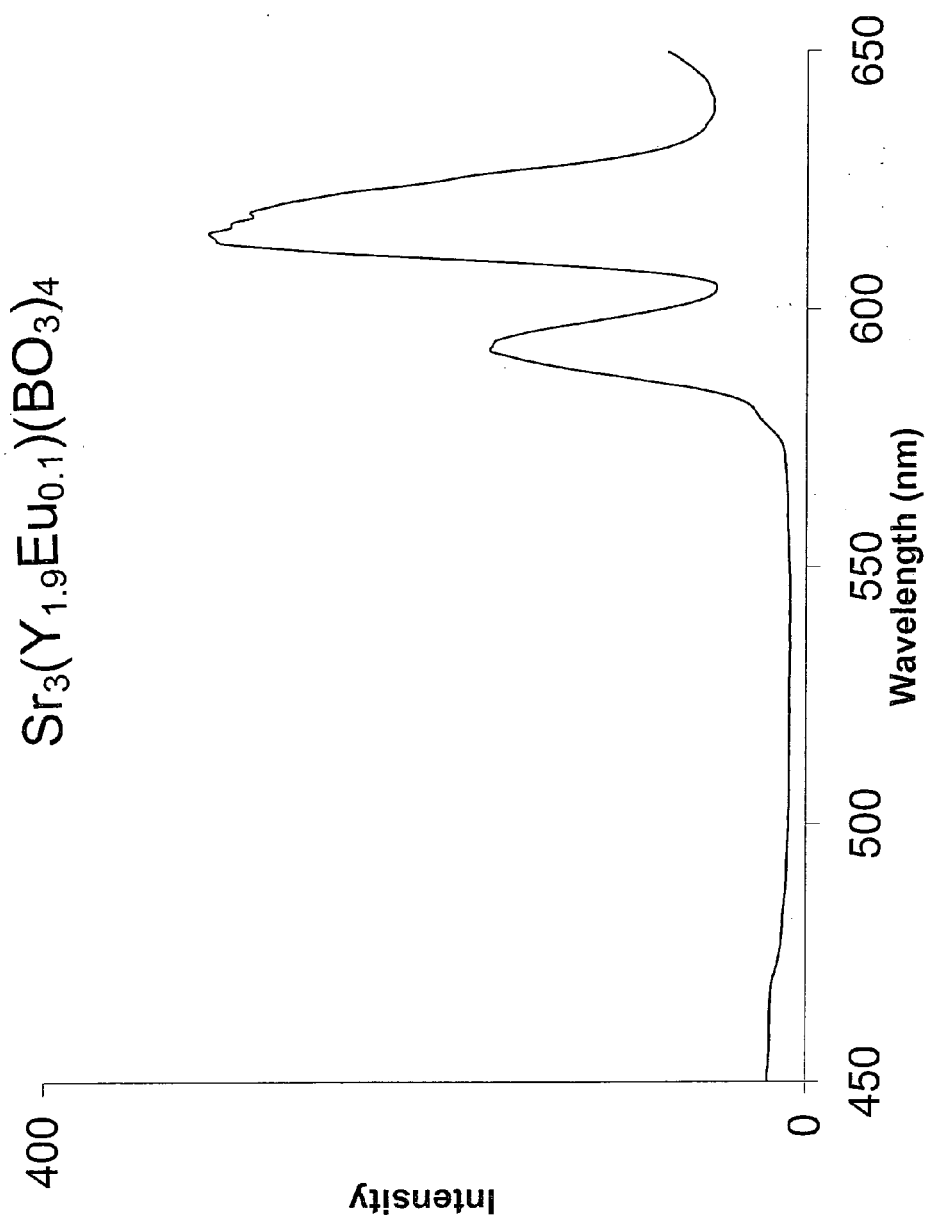
FIG. 7 is a graph showing the emission spectra of $Sr_3Y_{1.9}Eu_{0.1}(BO_3)_4$ at an excitation wavelength of 405 nm.
Figure 8:
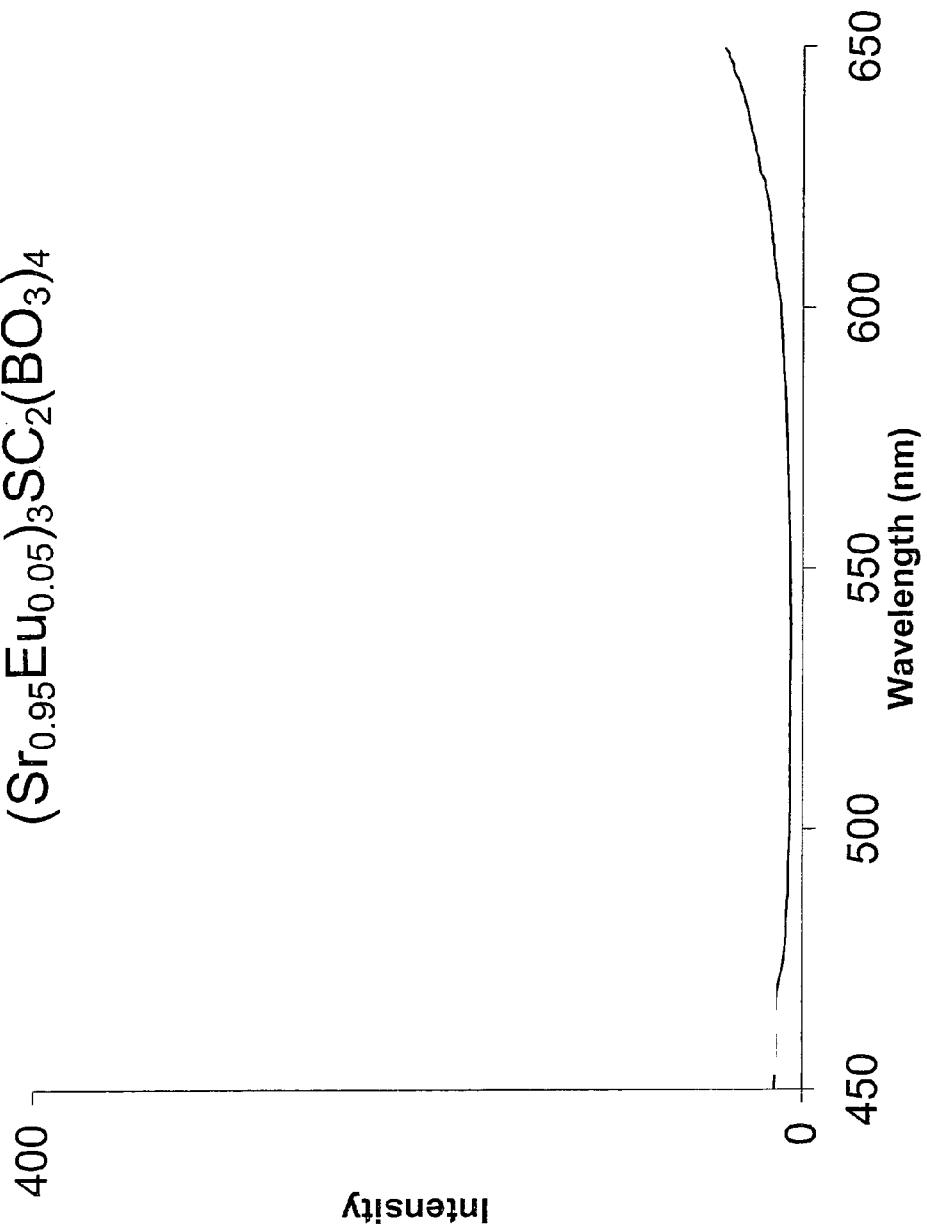
FIG. 8 is a graph showing the emission spectra of $(Sr_{0.95}Eu_{0.05})_3Sc_2(BO_3)_4$ at an excitation wavelength of 405 nm.
Figure 9:
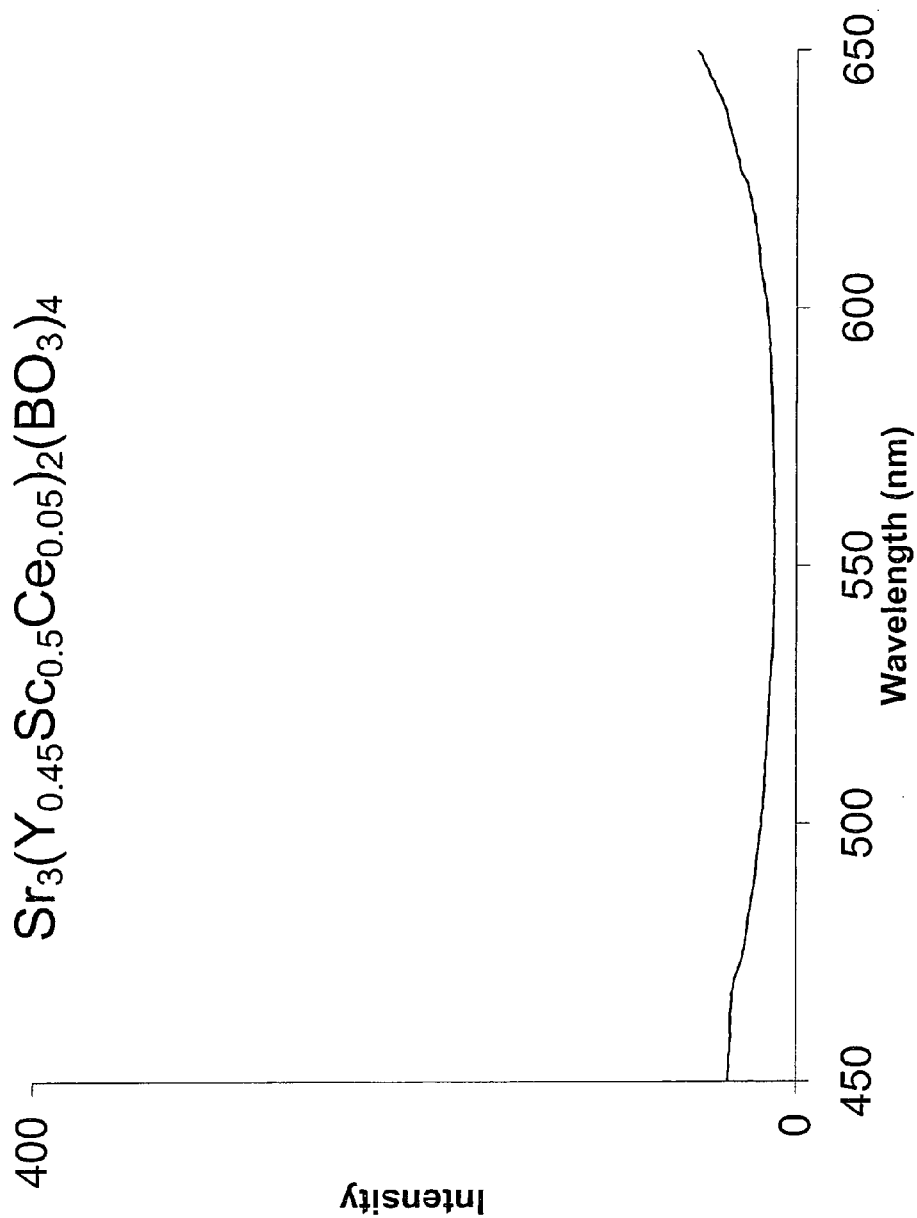
FIG. 9 is a graph showing the emission spectra of $Sr_3(Y_{0.45}Sc_{0.5}Ce_{0.05})_2(BO_3)_4$ at an excitation wavelength of 405 nm.
Figure 10:
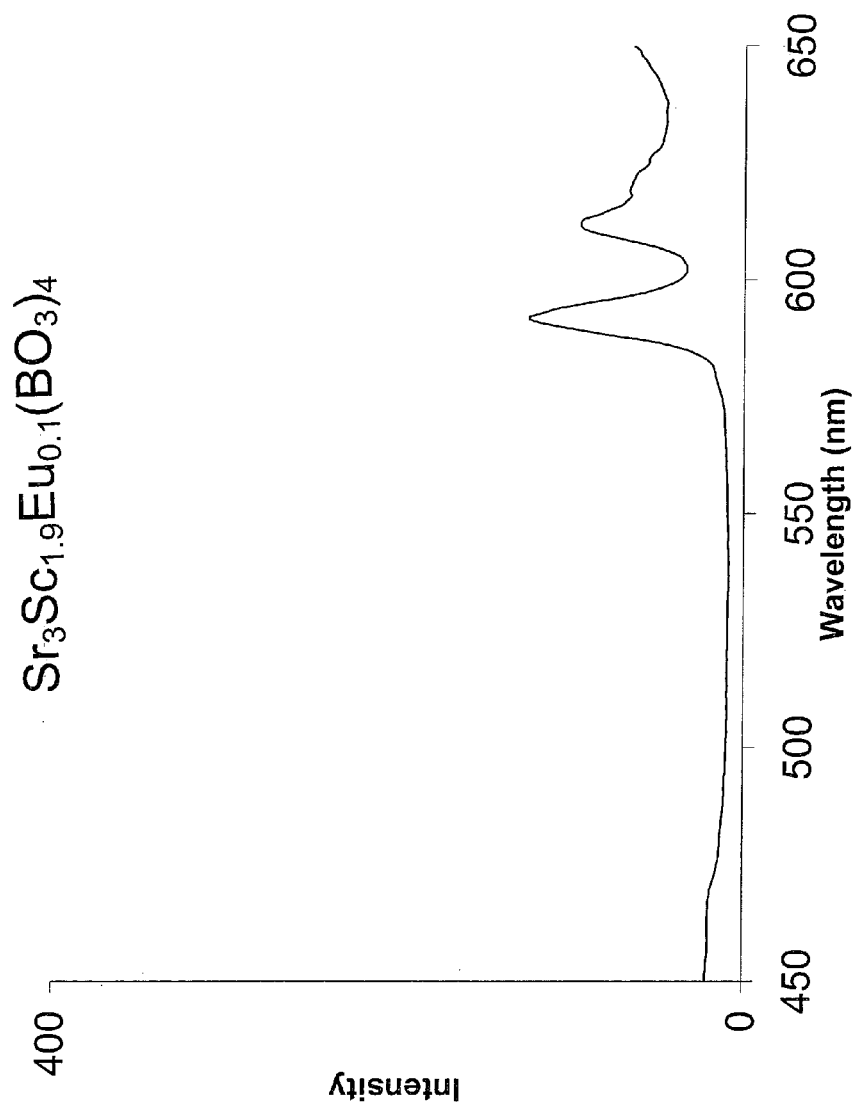
FIG. 10 is a graph showing the emission spectra of $Sr_3Sc_{1.9}Eu_{0.1}(BO_3)_4$ at an excitation wavelength of 405 nm.
Figure 11:
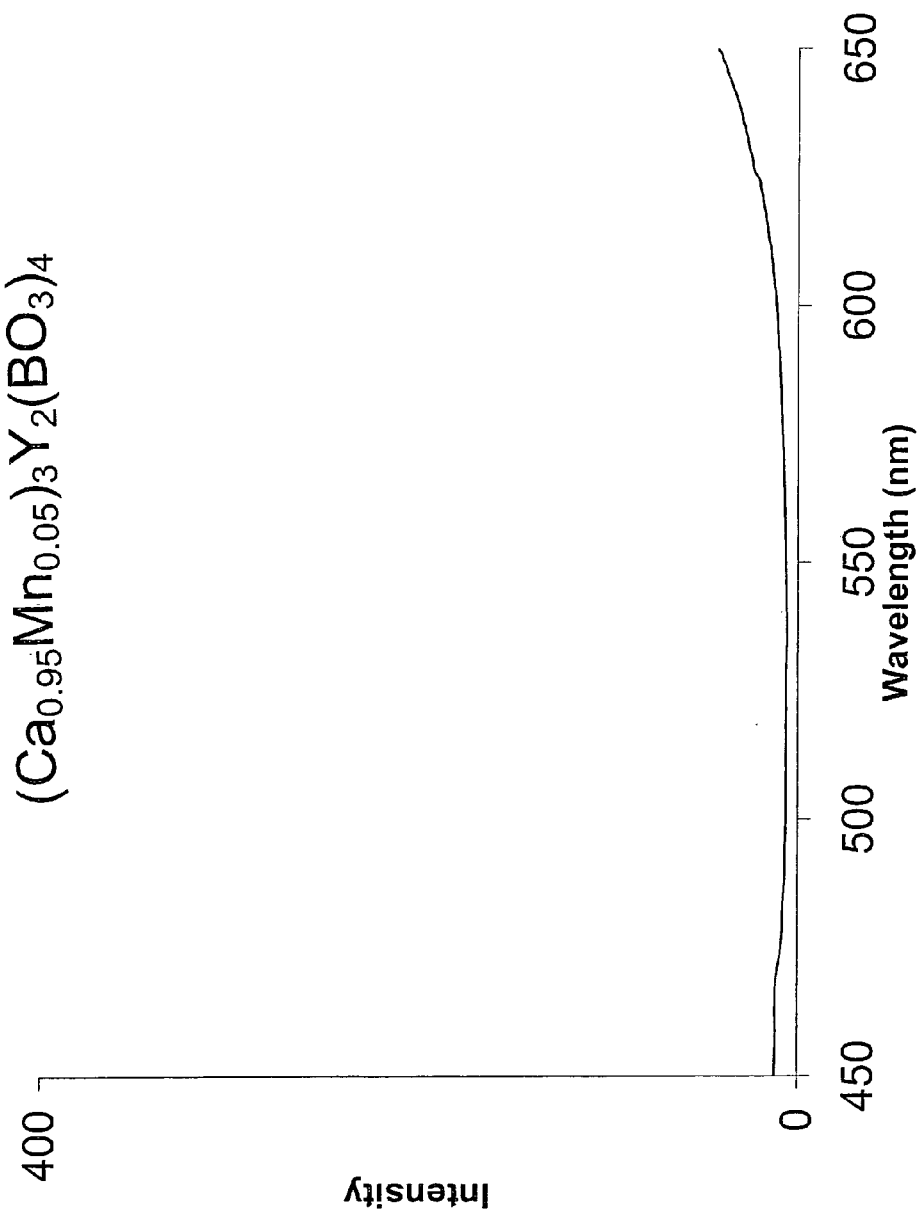
FIG. 11 is a graph showing the emission spectra of $(Ca_{0.95}Mn_{0.05})_3Y_2(BO_3)_4$ at an excitation wavelength of 405 nm.

FIGS. 5-11 are graphs showing the emission spectra of various phosphors according to the above first embodiment at an excitation wavelength of 405 nm. FIG. 5 is a graph showing the emission spectra of $(Sr_{0.95}Eu_{0.05})_3Y_2(BO_3)_4$. FIG. 6 is a graph showing the emission spectra of $Sr_3(Y_{0.95}Ce_{0.05})_2(BO_3)_4$. FIG. 7 is a graph showing the emission spectra of $Sr_3Y_{1.9}Eu_{0.1}(BO_3)_4$. FIG. 8 is a graph showing the emission spectra of $(Sr_{0.95}Eu_{0.05})_3Sc_2(BO_3)_4$. FIG. 9 is a graph showing the emission spectra of $Sr_3(Y_{0.45}Sc_{0.5}Ce_{0.05})_2(BO_3)_4$. FIG. 10 is a graph showing the emission spectra of $Sr_3Sc_{1.9}Eu_{0.1}(BO_3)_4$. FIG. 11 is a graph showing the emission spectra of $(Ca_{0.95}Mn_{0.05})_3Y_2(BO_3)_4$.

In a second embodiment, the phosphor composition includes an oxide or oxynitride phosphor having the formula $M'_{2-x}M''_x(Al, Ga)_{2-y}(Si, Ge)_yB_2O_{7-z}N_z:Eu^{2+}, Mn^{2+}, Pb^{2+}$ where M' is one or more of alkali metals Na and/or K, M" is one or more of alkaline earth Mg, Ca, Sr, Ba or Zn, $0 \leq x \leq 2$, $0 \leq y \leq 2$, $0 \leq z \leq 4$; and $z=x+y$. In this embodiment, the LED chip preferably has a peak emission in the range of from 200-500 nm, more preferably from 220-410 nm. Exemplary phosphors in this embodiment include $Ca_{0.9}NaAlSiB_2O_5N_2:Mn^{2+}$; $Sr_{0.9}NaAlSi_2B_2O_5N_2:Eu^{2+}$; $Ca_{0.9}Si_2B_2O_5N_2:Mn^{2+}$; $Sr_{0.9}Si_2B_2O_5N_2:Eu^{2+}$ and $Na_2Si_2B_2O_5N_2$.

Figure 12:
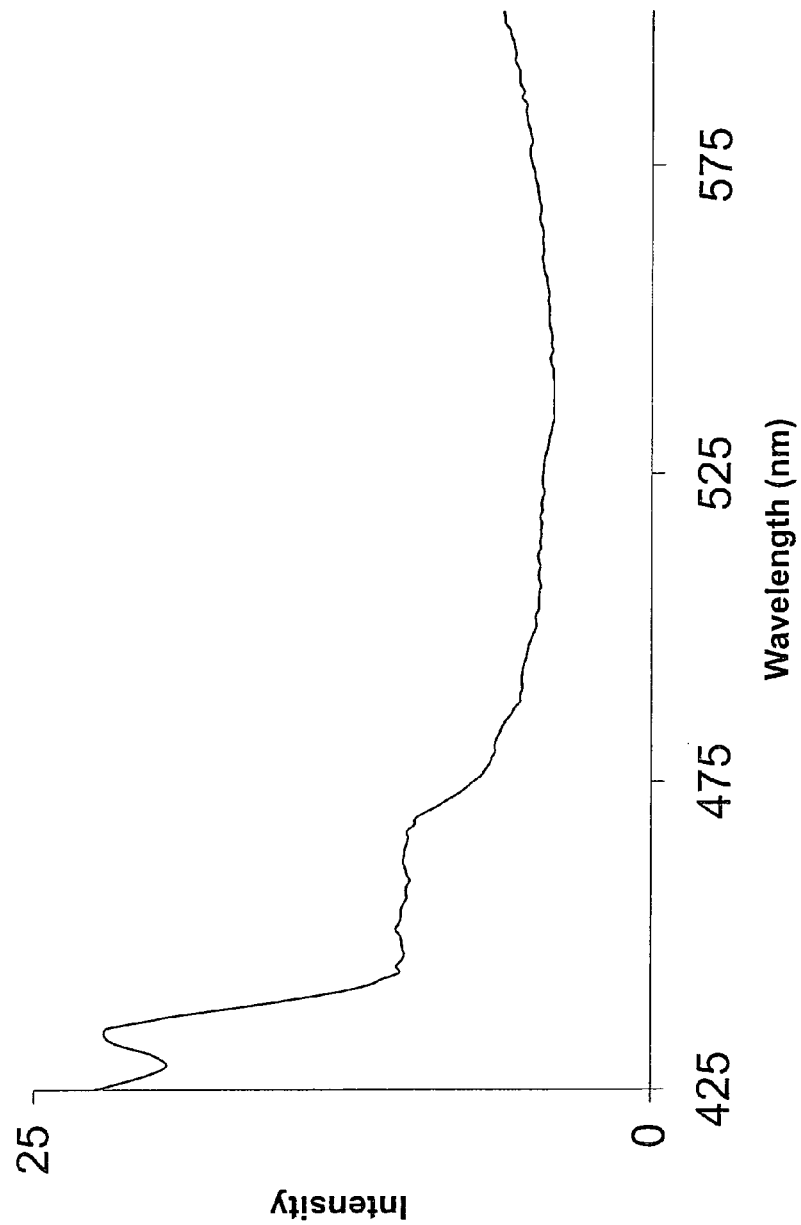
FIG. 12 is a graph showing the emission spectra of $Ca_{0.9}NaAlSiB_2O_5N_2:Mn^{2+}$ at an excitation wavelength of 405 nm.
Figure 13:
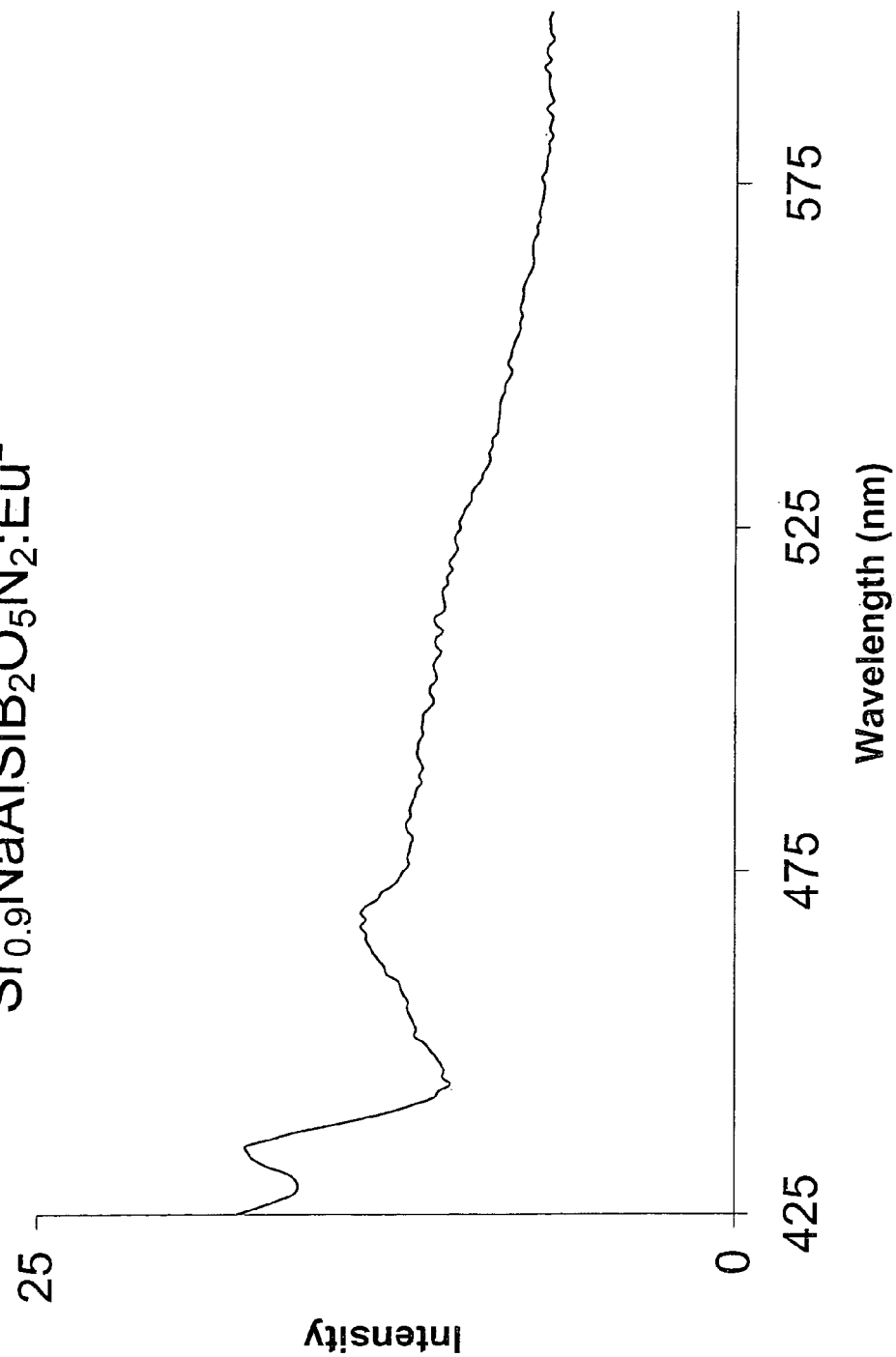
FIG. 13 is a graph showing the emission spectra of $Sr_{0.9}NaAlSiB_2O_5N_2:Eu^{2+}$ at an excitation wavelength of 405 nm.
Figure 14:
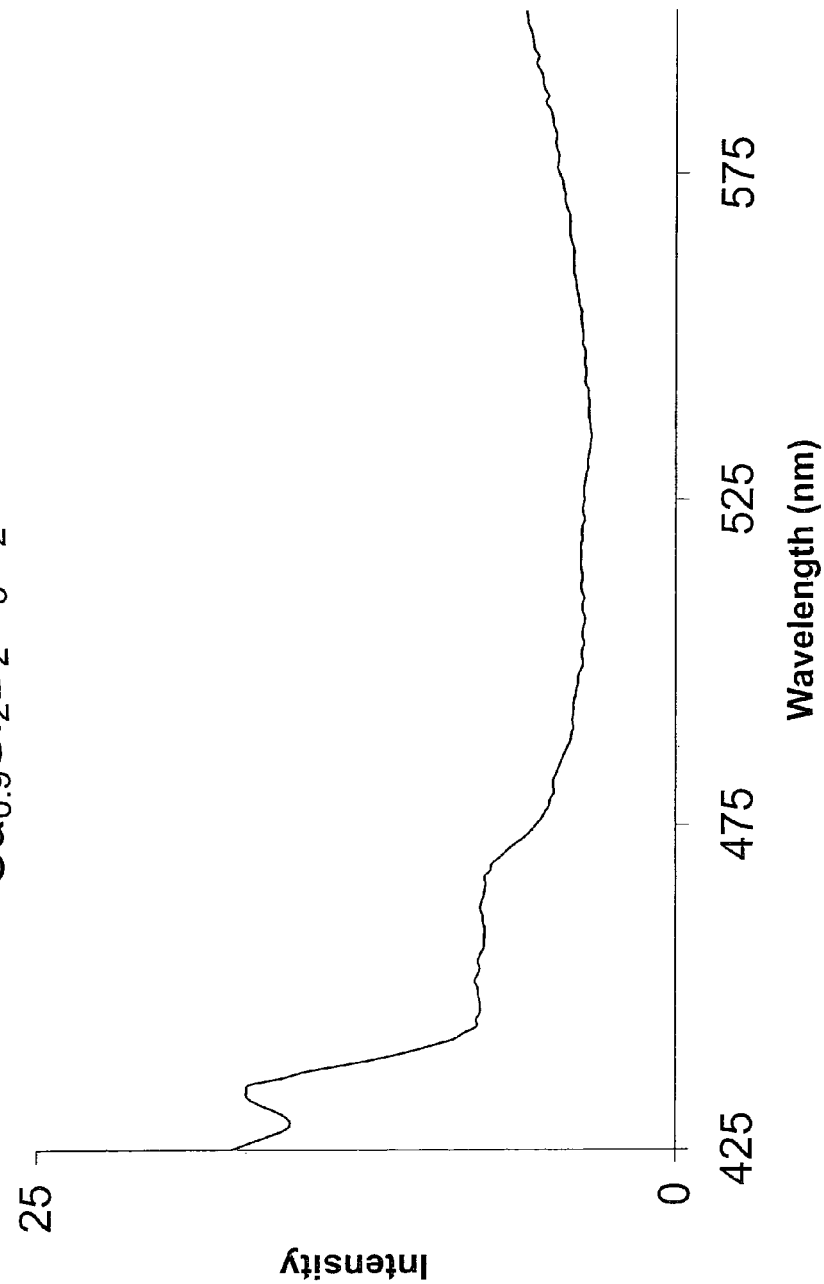
FIG. 14 is a graph showing the emission spectra of $Ca_{0.9}Si_2B_2O_5N_2:Mn^{2+}$ at an excitation wavelength of 405 nm.
Figure 15:
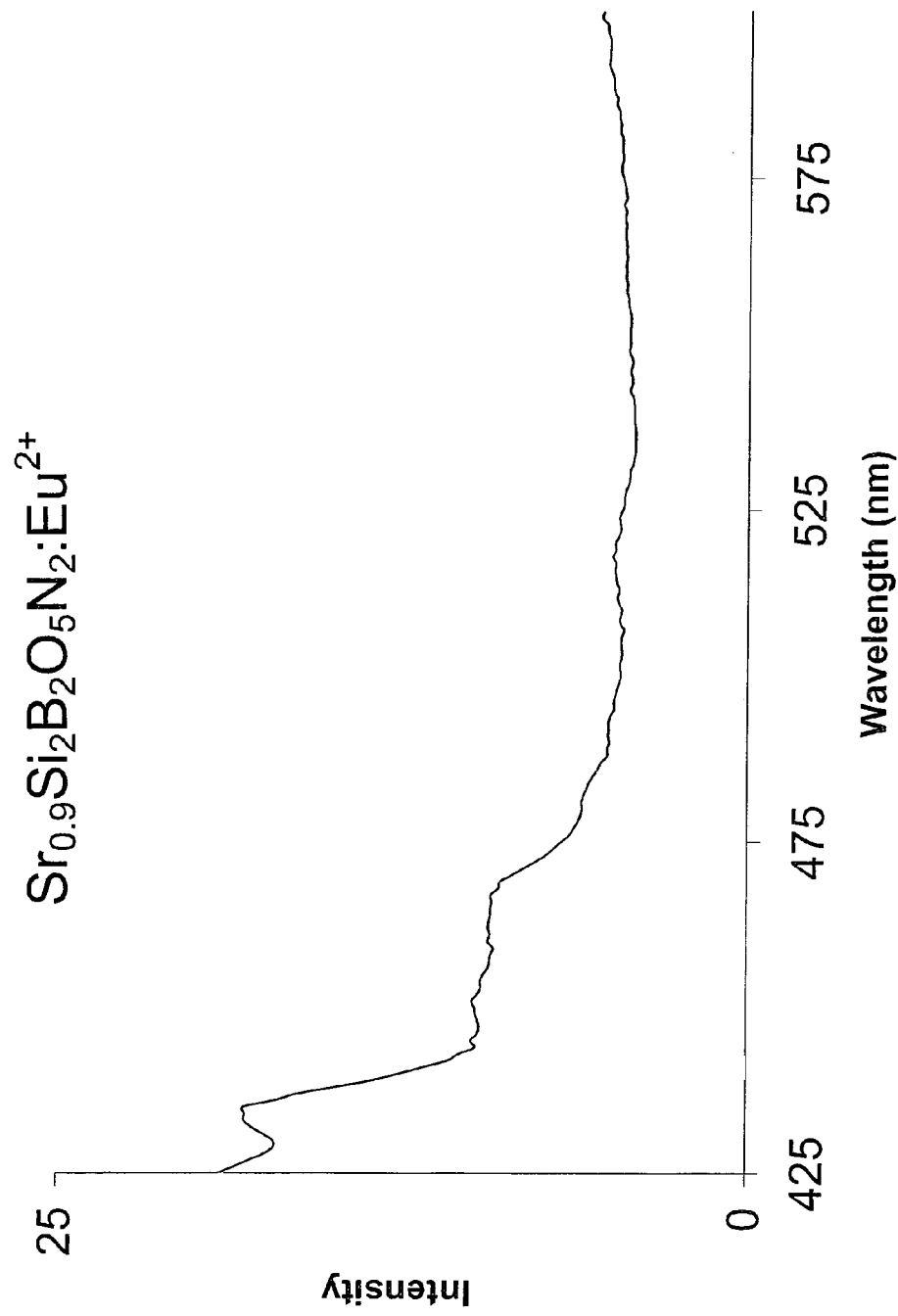
FIG. 15 is a graph showing the emission spectra of $Sr_{0.9}Si_2B_2O_5N_2:Eu^{2+}$ at an excitation wavelength of 405 nm.

FIGS. 12-15 are graphs showing the emission spectra of various phosphors according to the above second embodiment at an excitation wavelength of 405 nm. FIG. 12 is a graph showing the emission spectra of $Ca_{0.9}NaAlSi_2B_2O_5N_2:Mn^{2+}$. FIG. 13 is a graph showing the emission spectra of $Sr_{0.9}NaAlSiB_2O_5N_2:Eu^{2+}$. FIG. 14 is a graph showing the emission spectra of $Ca_{0.9}Si_2B_2O_5N_2:Mn^{2+}$. FIG. 15 is a graph showing the emission spectra of $Sr_{0.9}Si_2B_2O_5N_2:Eu^{2+}$.

In a third embodiment, the phosphor composition comprises $M'_{2-x+y}M''_{x-y}(Al, Ga)_{2-y}(Si, Ge)_yB_2O_{7-z-y'}N_zX_{y'}:Eu^{2+}, Mn^{2+}, Pb^{2+}$ where M' is one or more of alkali metals Na and/or K, M" is one or more of alkaline earth metals Mg, Ca, Sr, Ba and/or Zn, $0 \leq x \leq 2$, $0 \leq y \leq 2$, $0 \leq z \leq 4$; $z=x+y$, X=F and/or Cl, and $0 \leq y' \leq 2$.

In a fourth embodiment, the phosphor composition comprises $M'_{2-x}M''_xAl_{2-y+y}Si_{y-y}B_2O_{7-z-y'}N_zX_{y'}:Eu^{2+}, Mn^{2+}, Pb^{2+}$, where M' and M" are defined above, $0 \leq x \leq 2$, $0 \leq y \leq 2$, $0 \leq z \leq 4$; $z=x+y$, X=F and/or Cl, and $0 \leq y' \leq 2$.

In a fifth embodiment, the phosphor composition comprises $M'_{2-x+x'}M''_{x-x''}Al_{2-y+y}Si_{y-y}B_2O_{7-z-x'y'}N_zX_{(x'+y')}:Eu^{2+}, Mn^{2+}, Pb^{2+}$, where M' and M" are defined above $0 \leq x \leq 2$, $0 \leq y \leq 2$, $0 \leq z \leq 4$; $z=x+y$, X=F and/or Cl, and $0 \leq y' \leq 2$.

In a sixth embodiment, the phosphor composition comprises $MAl_2B_2O_7:Eu^{2+}, Mn^{2+}, Pb^{2+}$ where M=Mg,Ca,Sr, Ba and/or Zn.

In a seventh embodiment, the phosphor composition comprises $MAl_{2-x}Si_xB_2O_{7-x}N_x:Eu^{2+}, Mn^{2+}, Pb^{2+}$, where M=Mg, Ca, Sr, Ba and/or Zn, and $0 \leq x \leq 2$.

In an eight embodiment, the phosphor composition comprises $MAl_2B_{2-x}Si_xO_{7-x}N_x:Eu^{2+}, Mn^{2+}, Pb^{2+}$, where M=Mg, Ca, Sr, Ba and/or Zn, and $0 \leq x \leq 2$.

The above described phosphor compositions may be produced using known solution or solid state reaction processes for the production of phosphors by combining, for example, elemental oxides, carbonates and/or hydroxides as starting materials. Other starting materials may include nitrates, sulfates, acetates, citrates, or oxalates. Thus, according to one method for producing the above described carbonates may be used as a source for alkali and alkaline earth metals, $Al_2O_3$ and AlN may be used as a source of Al, $H_3BO_3$ may be used as a source of B, and $SiO_2$ and $Si_3N_4$ may be used as a source of Si. The source of N in an oxynitride phosphor could be AlN, or $Si_3N_4$. Alternately, coprecipitates of the rare earth oxides could be used as the starting materials for the RE elements. In a typical process, the starting materials are combined via a dry or wet blending process and fired in air or under a slightly reducing atmosphere at from, e.g., 1000 to 1600° C.

A fluxing agent may be added to the mixture before or during the step of mixing. This fluxing agent may be $NH_4Cl$ or any other conventional fluxing agent, such as a fluoride of at least one metal selected from the group consisting of terbium, aluminum, gallium, and indium. A quantity of a fluxing agent of less than about 20, preferably less than about 10, percent by weight of the total weight of the mixture is adequate for fluxing purposes.

The starting materials may be mixed together by any mechanical method including, but not limited to, stirring or blending in a high-speed blender or a ribbon blender. The starting materials may be combined and pulverized together in a bowl mill, a hammer mill, or a jet mill. If the mixture is wet, it may be dried first before being fired under a reducing atmosphere at a temperature from about 900° C. to about 1700° C., preferably from about 1000° C. to about 1600° C., for a time sufficient to convert all of the mixture to the final composition.

The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The crucible containing the mixture may be packed in a second closed crucible containing high-purity carbon particles and fired in air so that the carbon particles react with the oxygen present in air, thereby, generating carbon monoxide for providing a reducing atmosphere when needed—e.g. in the case of phosphors doped with $Ce^{3+}$. Alternatively, the reducing atmosphere may comprise a reducing gas such as hydrogen, carbon monoxide or a combination thereof in a predetermined amount (e.g. 1%), and optionally diluted with an inert gas such as nitrogen, argon, or a combination thereof.

These compounds may be blended and dissolved in a nitric acid solution. The strength of the acid solution is chosen to rapidly dissolve the oxygen-containing compounds and the choice is within the skill of a person skilled in the art. Ammonium hydroxide is then added in increments to the acidic solution. An organic base such as methanolamine, ethanolamine, propanolamine, dimethanolamine, diethanolamine, dipropanolamine, trimethanolamine, triethanolamine, or tripropanolamine may be used in place of ammonium hydroxide.

The precipitate is filtered, washed with deionized water, and dried. The dried precipitate is ball milled or otherwise thoroughly blended and then calcined in air at about 400° C. to about 1600° C. for a sufficient time to ensure a substantially complete dehydration of the starting material. The calcination may be carried out at a constant temperature. Alternatively, the calcination temperature may be ramped from ambient to and held at the final temperature for the duration of the calcination. The calcined material is similarly fired at 1000-1600° C. for a sufficient time under a reducing atmosphere such as $H_2$, CO, or a mixture of one of theses gases with an inert gas, or an atmosphere generated by a reaction between a coconut charcoal and the products of the decomposition of the starting materials to covert all of the calcined material to the desired phosphor composition.

While suitable in many applications alone with an appropriate LED chip, the above phosphors may be blended with each other or one or more additional phosphors for use in LED light sources. Thus, in another embodiment, an LED lighting assembly is provided including a phosphor composition comprising a blend of a phosphor from one of the above embodiments with one or more additional phosphors. When used in a lighting assembly in combination with a green to near UV LED emitting radiation in the range of about 235 to 550 nm, the resultant light emitted by the assembly will be a white light. In one embodiment, the phosphor composition comprises a blend of one of the above embodiment phosphors, as described above, with a blue and a green emitting phosphor and optionally one or more additional phosphors.

The relative amounts of each phosphor in the phosphor composition can be described in terms of spectral weight. The spectral weight is the relative amount that each phosphor contributes to the overall emission spectra of the phosphor blend. The spectral weight amounts of all the individual phosphors should add up to 1. A preferred blend comprises a spectral weight of from 0.001 to 0.200 of a blue phosphor, from 0.001 to 0.300 of a green phosphor, and the balance of the blend being one of the above described phosphors. Any known blue and green phosphor suitable for use in near-UV to green LED systems may be used. In addition, other phosphors such as red, blue-green, yellow, or other color phosphors may be used in the blend to customize the white color of the resulting light. While not intended to be limiting, suitable phosphor for use in the blend with the present invention phosphors include:

$(Ba, Sr, Ca)_5(PO_4)_3(Cl, F, Br, OH):Eu^{2+}, Mn^{2+}, Sb^{3+}$ $(Ba, Sr, Ca)BPO_5:Eu^{2+}, Mn^{2+}$ $(Sr, Ca)_{10}(PO_4)_6*nB_2O_3:Eu^{2+}$ $2SrO*0.84P_2O_5*0.16B_2O_3:Eu^{2+}$ $(Mg, Ca, Sr, Ba, Zn)_3B_2O_6:Eu^{2+}$ $Sr_2Si_3O_8.2SrCl_2:Eu^{2+}$ $Ba_3MgSi_2O_8:Eu^{2+}$ $Sr_4Al_{14}O_{25}:Eu^{2+}$ $BaAl_8O_{13}:Eu^{2+}$ $(Ba, Sr, Ca)MgAl_{10}O_{17}:Eu^{2+}, Mn^{2+}$ $(Ba, Sr, Ca)Al_2O_4:Eu^{2+}$ $(Y, Gd, Lu, Sc, La)BO_3:Ce^{3+}, Tb^{3+}$ $Ca_8Mg(SiO_4)_4Cl_2:Eu^{2+}, Mn^{2+}$ $(Ba, Sr, Ca)_2SiO_4:Eu^{2+}$ $(Ba, Sr, Ca)_2(Mg, Zn)Si_2O_7:Eu^{2+}$ $(Sr, Ca, Ba)(Al, Ga, In)_2S_4:Eu^{2+}$ $(Y, Gd, Tb, La, Sm, Pr, Lu)_3(Al, Ga)_5O_{12}:Ce^{3+}$ $(Ca, Sr)_8(Mg, Zn)(SiO_4)_4Cl_2:Eu^{2+}, Mn^{2+}$ $Na_2Gd_2B_2O_7:Ce^{3+}, Tb^{3+}$ $(Ba, Sr)_2(Ca, Mg, Zn)B_2O_6:K, Ce, Tb$ $(Gd, Y, Lu, La)_2O_3:Eu^{3+}, Bi^{3+}$ $(Gd, Y, Lu, La)_2O_2S:Eu^{3+}, Bi^{3+}$ $(Gd, Y, Lu, La)VO_4:Eu^{3+}, Bi^{3+}$ $(Ca, Sr)S:Eu^{2+}$ $SrY_2S_4:Eu^{2+}$ $CaLa_2S_4:Ce^{3+}$ $(Y, Lu)_2WO_6:Eu^{3+}, Mo^{6+}$ $(Mg, Ca, Sr, Ba, Zn)_y(Si, Ge)_yN_{(2v/3+4y/3)}:Eu^{2+}$ $(Mg, Ca, Sr, Ba, Zn)_v(Si, Ge)_yO_zN_{(2v/3+4y/3+2z/3)}:Eu^{2+}$

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.30 to about 0.55, and a y value in the range of about 0.30 to about 0.55. As stated, however, the exact identity and amounts of each phosphor in the phosphor composition can be varied according to the needs of the end user.

The phosphor composition described above may be used in additional applications besides LEDs. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are meant to be merely exemplary and not exhaustive. A specific contemplate use for the above phosphors is in a gas discharge lamp (e.g. a mercury discharge lamp) including a lamp envelope containing a pair of electrodes, an ionizable medium contained therein, and a layer of the phosphor on an inner surface of the lamp envelope.

The invention has been described with reference to various preferred embodiments. Modifications and alteration will occur to others upon a reading and understanding of this specification. The invention is intended to include all such modifications and alterations insofar as they come within the scope of the appended claims or the equivalent thereof.

What is claimed is:

1. A lighting apparatus for emitting white light comprising:

a semiconductor light source; and a phosphor composition radiationally coupled to the light source, the phosphor composition comprising a phosphor composition including at least one of:

(A) $M_3Ln_2(BO_3)_4$ doped with at least one activator selected from the group of $Eu^{2+}$, $Mn^{2+}$, $Pb^{2+}$, $Ce^{3+}$, $Eu^{3+}$, $Tb^{3+}$, and $Bi^{3+}$ where M is at least one of Mg, Ca, Sr, Ba, or Zn, and Ln is at least one of Sc, Y, La, Gd, or Lu;

(B) $M'_{2-x}M''_x(Al, Ga)_{2-y}(Si, Ge)_yB_2O_{7-z}N_z:Eu^{2+}, Mn^{2+}, Pb^{2+}$ where M' is one or more of alkali metals Na and/or K, M" is one or more of alkaline earth Mg, Ca, Sr, Ba or Zn, $0 \leq x \leq 2$, $0 \leq y \leq 2$, $0 \leq z \leq 4$; and $z=x+y$;

(C) $M'_{2-x+x'}M''_{x-x'}(Al, Ga)_{2-y}(Si, Ge)_yB_2O_{7-z-y'}N_zX_{y'}:Eu^{2+}, Mn^{2+}, Pb^{2+}$, where M' is one or more of alkali metals Na and/or K, M" is one or more of alkaline earth metals Mg, Ca, Sr, Ba and/or Zn, $0 \leq x \leq 2$, $0 \leq y \leq 2$, $0 \leq z \leq 4$; $z=x+y$, X=F and/or Cl, and $0 \leq y' \leq 2$;

(D) $M'_{2-x}M''_xAl_{2-y+y'}Si_{y-y'}B_2O_{7-z-y'}N_zX_{y'}:Eu^{2+}, Mn^{2+}, Pb^{2+}$, where M' and M" are defined above, $0 \leq x \leq 2$, $0 \leq y \leq 2$, $0 \leq z \leq 4$; $z=x+y$, X=F and/or Cl, and $0 \leq y' \leq 2$;

(E) $M'_{2-x+x'}M''_{x-x''}Al_{2-y+y'}Si_{y-y'}B_2O_{7-z-x'-y'}N_zX_{(x'+y')}:Eu^{2+}, Mn^{2+}, Pb^{2+}$, where M' and M" are defined above, $0 \leq x \leq 2$, $0 \leq y \leq 2$, $0 \leq z \leq 4$; $z=x+y$, X=F and/or Cl, and $0 \leq y' \leq 2$;

(F) $MAl_2B_2O_7:Eu^{2+}, Mn^{2+}, Pb^{2+}$ where M=Mg, Ca, Sr, Ba and/or Zn;

(G) $MAl_{2-x}Si_xB_2O_{7-x}N_x:Eu^{2+}, Mn^{2+}, Pb^{2+}$, where M=Mg, Ca, Sr, Ba and/or Zn, and $0 \leq x \leq 2$; or (H) $MAl_2B_{2-x}Si_xO_{7-x}N_x:Eu^{2+}, Mn^{2+}, Pb^{2+}$, where M=Mg, Ca, Sr, Ba and/or Zn, and $0 \leq x \leq 2$.

2. The lighting apparatus of claim 1, wherein the light source is a semiconductor light emitting diode (LED) emitting radiation having a wavelength in the range of from about 370 to about 405 nm.

3. The lighting apparatus of claim 2, wherein the LED comprises a nitride compound semiconductor represented by the formula $In_iGa_jAl_kN$, where $0 \leq i$; $0 \leq j$, $0 \leq K$, and $i+j+k=1$.

4. The lighting apparatus of claim 1, wherein the light source is an organic emissive structure.

5. The lighting apparatus of claim 1, wherein the phosphor composition is coated on the surface of the light source.

6. The lighting apparatus of claim 1, further comprising an encapsulant surrounding the light source and the phosphor composition.

7. The lighting apparatus of claim 1, wherein the phosphor composition is dispersed in the encapsulant.

8. The lighting apparatus of claim 1, further comprising a reflector cup.

9. The lighting apparatus of claim 1, wherein said phosphor composition further comprises one or more additional phosphor.

10. The lighting apparatus of claim 9, wherein said one or more additional phosphors are selected from the group consisting of $(Ba, Sr, Ca)_5(PO_4)_3(Cl, F, Br, OH):Eu^{2+}, Mn^{2+}, Sb^{3+}$; $(Ba, Sr, Ca)MgAl_{10}O_{17}:Eu^{2+}, Mn^{2+}$; $(Ba, Sr, Ca)BPO_5:Eu^{2+}, Mn^{2+}$; $(Sr, Ca)_{10}(PO_4)_6*nB_2O_3:Eu^{2+}$; $2SrO*0.84P_2O_5*0.16B_2O_3:Eu^{2+}$; $Sr_2Si_3O_{8*2}SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $Sr_4Al_{14}O_{25}:Eu^{2+}$; $BaAl_8O_{13}:Eu^{2+}$; $2SrO\text{-}0.84P_2O_{5-0.16}B_2O_3:Eu^{2+}$; $(Ba, Sr, Ca)MgAl_{10}O_{17}:Eu^{2+}, Mn^{2+}$; $(Ba, Sr, Ca)_5(PO_4)_3(Cl, F, OH):Eu^{2+}, Mn^{2+}, Sb^{3+}$; $(Ba, Sr, Ca)MgAl_{10}O_{17}:Eu^{2+}, Mn^{2+}$; $(Ba, Sr, Ca)Al_2O_4:Eu^{2+}$; $(Y, Gd, Lu, Sc, La)BO_3:Ce^{3+}, Tb^{3+}$; $Ca_8Mg(SiO_4)_4Cl_2:Eu^{2+}, Mn^{2+}$; $(Ba, Sr, Ca)_2SiO_4:Eu^{2+}$; $(Ba, Sr, Ca)_2(Mg, Zn)Si_2O_7:Eu^{2+}$; $(Sr, Ca, Ba)(Al, Ga, In)_2S_4:Eu^{2+}$; $(Y, Gd, Tb, La, Sm, Pr, Lu)_3(Al, Ga)_5O_{12}:Ce^{3+}$; $(Ca, Sr)_8(Mg, Zn)(SiO_4)_4Cl_2:Eu^{2+}, Mn^{2+}$ (CASI); $Na_2Gd_2B_2O_7:Ce^{3+}, Tb^{3+}$; $(Ba, Sr)_2(Ca, Mg, Zn)B_2O_6:K, Ce, Tb$; $(Sr, Ca, Ba, Mg, Zn)_2P_2O_7:Eu^{2+}, Mn^{2+}$ (SPP); $(Ca, Sr, Ba, Mg)_{10}(PO_4)_6(F, Cl, Br, OH):Eu^{2+}, Mn^{2+}$; $(Gd, Y, Lu, La)_2O_3:Eu^{3+}, Bi^{3+}$; $(Gd, Y, Lu, La)_2O_2S:Eu^{3+}, Bi^{3+}$; $(Gd, Y, Lu, La)VO_4:Eu^{3+}, Bi^{3+}$; $(Ca, Sr)S:Eu^{2+}$; $SrY_2S_4:Eu^{2+}$; $CaLa_2S_4:Ce^{3+}$; $(Ca, Sr)S:Eu^{2+}$; $3.5 MgO*0.5 MgF_2*GeO_2:Mn^{4+}$; $(Ba, Sr, Ca)MgP_2O_7:Eu^{2+}, Mn^{2+}$; $(Y, Lu)_2WO_6:Eu^{3+}, Mo^{6+}$; $(Ba, Sr, Ca)_xSi_yN_z:Eu^{2+}$.

11. The lighting apparatus of claim 1, wherein said phosphor is selected from the group consisting of $(Sr_{0.95}Eu_{0.05})_3Y_2(BO_3)_4$; $Sr_3(Y_{0.95}Ce_{0.05})_2(BO_3)_4$; $Sr_3Y_{1.9}Eu_{0.1}(BO_3)_4$; $(Sr_{0.95}Eu_{0.05})_3Sc_2(BO_3)_4$; $Sr_3(Y_{0.45}Sc_{0.5}Ce_{0.05})_2(BO_3)_4$; $Sr_3Sc_{1.9}Eu_{0.1}(BO_3)_4$; and $(Ca_{0.95}Mn_{0.05})_3Y_2(BO_3)_4$.

12. The lighting apparatus of claim 1, wherein said phosphor is selected from the group consisting of $Ca_{0.9}NaAlSiB_2O_5N_2:Mn^{2+}$; $Sr_{0.9}NaAlSiB_2O_5N_2:Eu^{2+}$; $Ca_{0.9}Si_2B_2O_5N_2:Mn^{2+}$; $Sr_{0.9}Si_2B_2O_5N_2:Eu^{2+}$; and $Na_2Si_2B_2O_5N_2:Eu^{2+}$.

13. A phosphor having the formula $M_3Ln_2(BO_3)_4$ doped with at least one activator selected from the group of $Eu^{2+}$, $Mn^{2+}$, $Pb^{2+}$, $Ce^{3+}$, $Eu^{3+}$, $Tb^{3+}$, and $Bi^{3+}$ where M is at least one of Mg, Ca, Sr, Ba, or Zn, and Ln is at least one of Sc, Y, La, Gd, or Lu.

14. The phosphor of claim 13, comprising at least one of $(Sr_{0.95}Eu_{0.05})_3Y_2(BO_3)_4$; $Sr_3(Y_{0.95}Ce_{0.05})_2(BO_3)_4$; $Sr_3Y_{1.9}Eu_{0.1}(BO_3)_4$; $(Sr_{0.95}Eu_{0.05})_3Sc_2(BO_3)_4$; $Sr_3(Y_{0.45}Sc_{0.5}Ce_{0.05})_2(BO_3)_4$; $Sr_3Sc_{1.9}Eu_{0.1}(BO_3)_4$; and $(Ca_{0.95}Mn_{0.05})_3Y_2(BO_3)_4$.

15. A phosphor having the formula $M'_{2-x}M''_x(Al, Ga)_{2-y}(Si, Ge)_yB_2O_{7-z}N_z:Eu^{2+}, Mn^{2+}, Pb^{2+}$ where M' is one or more of alkali metals Na and/or K, M" is one or more of alkaline earth Mg, Ca, Sr, Ba or Zn, $0 \leq x \leq 2$, $0 \leq y \leq 2$, $0 \leq z \leq 4$; and $z=x+y$.

16. The phosphor of claim 15 comprising at least one of $Ca_{0.9}NaAlSiB_2O_5N_2:Mn^{2+}$; $Sr_{0.9}NaAlSiB_2O_5N_2:Eu^{2+}$; $Ca_{0.9}Si_2B_2O_5N_2:Mn^{2+}$; $Sr_{0.9}Si_2B_2O_5N_2:Eu^{2+}$; and $Na_2Si_2B_2O_5N_2$.

17. A phosphor blend comprising:

(A) a first phosphor selected from the group consisting of
(1) $M_3Ln_2(BO_3)_4$ doped with at least one activator selected from the group of $Eu^{2+}$, $Mn^{2+}$, $Pb^{2+}$, $Ce^{3+}$, $Eu^{3+}$, $Tb^{3+}$, and $Bi^{3+}$ where M is at least one of Mg, Ca, Sr, Ba, or Zn, and Ln is at least one of Sc, Y, La, Gd, or Lu; (2) $M_{2-x}M'_x(Al, Ga)_{2-y}(Si, Ge)_yB_2O_{7-z}N_z:Eu^{2+}, Mn^{2+}, Pb^{2+}$ where M' is one or more of alkali metals Na and/or K, M" is one or more of alkaline earth Mg, Ca, Sr, Ba or Zn, $0 \leq x \leq 2$, $0 \leq y \leq 2$, $0 \leq z \leq 4$; and $z=x+y$; (3) $M'_{2-x+y}M''_{x-y}(Al, Ga)_{2-y}(Si, Ge)_yB_2O_{7-z-y'}N_zX_{y'}:Eu^{2+}, Mn^{2+}, Pb^{2+}$, where M' is one or more of alkali metals Na and/or K, M" is one or more of alkaline earth metals Mg, Ca, Sr, Ba and/or Zn, $0 \leq x \leq 2$, $0 \leq y \leq 2$, $0 \leq z \leq 4$; $z=x+y$, X=F and/or Cl, and $0 \leq y' \leq 2$; (4) $M'_{2-x}M''_xAl_{2-y+y'}Si_{y-y'}B_2O_{7-z-y'}N_zX_{y'}:Eu^{2+}, Mn^{2+}, Pb^{2+}$, where M' and M" are defined above, $0 \leq x \leq 2$, $0 \leq y \leq 2$, $0 \leq z \leq 4$; $z=x+y$, X=F and/or Cl, and $0 \leq y' \leq 2$; (5) $M'_{2-x+x''}M''_{x-x''}Al_{2-y+y'}Si_{y-y'}B_2O_{7-z-x'-y'}N_zX_{(x'+y')}:Eu^{2+}, Mn^{2+}, Pb^{2+}$, where M' and M" are defined above, $0 \leq x \leq 2$, $0 \leq y \leq 2$, $0 \leq z \leq 4$; $z=x+y$, X=F and/or Cl, and $0 \leq y' \leq 2$; (6) $MAl_2B_2O_7:Eu^{2+}, Mn^{2+}, Pb^{2+}$; where M=Mg, Ca, Sr, Ba or Zn; (7) $MAl_{2-x}Si_xB_2O_{7-x}N_x:Eu^{2+}, Mn^{2+}, Pb^{2+}$ where M=Mg, Ca, Sr, Ba and/or Zn, and $0 \leq x \leq 2$; and (8), $MAl_2B_{2-x}Si_xO_{7-x}N_x:Eu^{2+}, Mn^{2+}, Pb^{2+}$ where M=Mg, Ca, Sr, Ba and/or Zn, and $0 \leq x \leq 2$;

(B) and at least one additional phosphor.

18. A phosphor blend according to claim 17, wherein said at least one additional phosphor is selected from the group consisting of $(Ba, Sr, Ca)_5(PO_4)_3(Cl, F, Br, OH):Eu^{2+}, Mn^{2+}, Sb^{3+}$; $(Ba, Sr, Ca)MgAl_{10}O_{17}:Eu^{2+}, Mn^{2+}$; $(Ba, Sr, Ca)BPO_5:Eu^{2+}, Mn^{2+}$; $(Sr, Ca)_{10}(PO_4)_6*nB_2O_3:Eu^{2+}$; $2SrO*0.84P_2O_5*0.16B_2O_3:Eu^{2+}$; $Sr_2Si_3O_{8*2}SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $Sr_4Al_{14}O_{25}:Eu^{2+}$; $BaAl_8O_{13}:Eu^{2+}$; $2SrO\text{-}0.84P_2O_{5-0.16}B_2O_3:Eu^{2+}$; $(Ba, Sr, Ca)MgAl_{10}O_{17}:Eu^{2+}, Mn^{2+}$; $(Ba, Sr, Ca)_5(PO_4)_3(Cl, F, OH):Eu^{2+}, Mn^{2+}, Sb^{3+}$; $(Ba, Sr, Ca)MgAl_{10}O_{17}:Eu^{2+}, Mn^{2+}$; $(Ba, Sr, Ca)Al_2O_4:Eu^{2+}$; $(Y, Gd, Lu, Sc, La)BO_3:Ce^{3+}, Tb^{3+}$; $Ca_8Mg(SiO_4)_4Cl_2:Eu^{2+}, Mn^{2+}$; $(Ba, Sr, Ca)_2SiO_4:Eu^{2+}$; $(Ba, Sr, Ca)_2(Mg, Zn)Si_2O_7:Eu^{2+}$; $(Sr, Ca, Ba)(Al, Ga, In)_2S_4:Eu^{2+}$; $(Y, Gd, Tb, La, Sm, Pr, Lu)_3(Al, Ga)_5O_{12}:Ce^{3+}$; $(Ca, Sr)_8(Mg, Zn)(SiO_4)_4Cl_2:Eu^{2+}, Mn^{2+}$ (CASI); $Na_2Gd_2B_2O_7:Ce^{3+}, Tb^{3+}$; $(Ba, Sr)_2(Ca, Mg, Zn)B_2O_6:K, Ce, Tb$; $(Sr, Ca, Ba, Mg, Zn)_2P_2O_7:Eu^{2+}, Mn^{2+}$ (SPP); $(Ca, Sr, Ba, Mg)_{10}(PO_4)_6(F, Cl, Br, OH):Eu^{2+}, Mn^{2+}$; $(Gd, Y, Lu, La)_2O_3:Eu^{3+}, Bi^{3+}$; $(Gd, Y, Lu, La)_2O_2S:Eu^{3+}, Bi^{3+}$; $(Gd, Y, Lu, La)VO_4:Eu^{3+}, Bi^{3+}$; $(Ca, Sr)S:Eu^{2+}$; $SrY_2S_4:Eu^{2+}$; $CaLa_2S_4:Ce^{3+}$; $(Ca, Sr)S:Eu^{2+}$; $3.5 MgO*0.5 MgF_2*GeO_2:Mn^{4+}$; $(Ba, Sr, Ca)MgP_2O_7:Eu^{2+}, Mn^{2+}$; $(Y, Lu)_2WO_6:Eu^{3+}, Mo^{6+}$; $(Ba, Sr, Ca)_xSi_yN_z:Eu^{2+}$; and blends thereof.

19. An arc discharge lamp having an improved color rendering index for a given color coordinated temperature, the lamp comprising:

a lamp envelope enclosing a discharge space and having an inner surface;

an ionizable medium within said lamp envelope comprising mercury and an inert gas;
first and second electrodes; and
a phosphor layer disposed on an inner surface of the lamp envelope comprising a phosphor composition including at least one of:

(A) $M_3Ln_2(BO_3)_4$ doped with at least one activator selected from the group of $Eu^{2+}$, $Mn^{2+}$, $Pb^{2+}$, $Ce^{3+}$, $Eu^{3+}$, $Tb^{3+}$, and $Bi^{3+}$ where M is at least one of Mg, Ca, Sr, Ba, or Zn, and Ln is at least one of Sc, Y, La, Gd, or Lu;

(B) $M'_{2-x}M''_x(Al, Ga)_{2-y}(Si, Ge)_y B_2 O_{7-z} N_z:Eu^{2+}$, $Mn^{2+}$, $Pb^{2+}$ where M' is one or more of alkali metals Na and/or K, M" is one or more of alkaline earth Mg, Ca, Sr, Ba or Zn, $0 \leq x \leq 2$, $0 \leq y \leq 2$, $0 \leq z \leq 4$; and $z=x+y$;

(C) $M'_{2-x+y}M''_{x-y}(Al, Ga)_{2-y}(Si, Ge)_y B_2 O_{7-z-y} N_z X_y$: $Eu^{2+}$, $Mn^{2+}$, $Pb^{2+}$, where M' is one or more of alkali metals Na and/or K, M" is one or more of alkaline earth metals Mg, Ca, Sr, Ba and/or Zn, $0 \leq x \leq 2$, $0 \leq y \leq 2$, $0 \leq z \leq 4$; $z=x+y$, X=F and/or Cl, and $0 \leq y' \leq 2$;

(D) $M'_{2-x}M''_x Al_{2-y+y'}Si_{y-y'}B_2 O_{7-z-y'}N_z X_{y'}:Eu^{2+}$, $Mn^{2+}$, $Pb^{2+}$, where M' and M" are defined above, $0 \leq x \leq 2$, $0 \leq y \leq 2$, $0 \leq z \leq 4$; $z=x+y$, X=F and/or Cl, and $0 \leq y' \leq 2$;

(E) $M'_{2-x+x'}M''_{x-x'}Al_{2-y+y'}Si_{y-y'}B_2 O_{7-z-x'-y'}N_z X_{(x'+y')}$: $Eu^{2+}$, $Mn^{2+}$, $Pb^{2+}$, where M' and M" are defined above, $0 \leq x \leq 2$, $0 \leq y \leq 2$, $0 \leq z \leq 4$; $z=x+y$, X=F and/or Cl, and $0 \leq y' \leq 2$;

(F) $MAl_2B_2O_7:Eu^{2+}$, $Mn^{2+}$, $Pb^{2+}$ where M=Mg, Ca, Sr, Ba and/or Zn;

(G) $MAl_{2-x}Si_x B_2 O_{7-x} N_x:Eu^{2+}$, $Mn^{2+}$, $Pb^{2+}$, where M=Mg, Ca, Sr, Ba and/or Zn, and $0 \leq x \leq 2$; or (H) $MAl_2 B_{2-x} S_x O_{7-x} N_x:Eu^{2+}$, $Mn^{2+}$, $Pb^{2+}$, where M=Mg, Ca, Sr, Ba and/or Zn, and $0 \leq x \leq 2$.

* * * * *